United States Patent
Ikehashi et al.

(10) Patent No.: US 6,771,546 B2
(45) Date of Patent: Aug. 3, 2004

(54) SEMICONDUCTOR MEMORY DEVICE AND METHOD OF CONTROLLING THE SAME

(75) Inventors: Tamio Ikehashi, Kanagawa (JP); Takashi Ohsawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/298,004

(22) Filed: Nov. 18, 2002

(65) Prior Publication Data

US 2004/0052142 A1 Mar. 18, 2004

(30) Foreign Application Priority Data

Sep. 18, 2002 (JP) ........................................ 2002-272022

(51) Int. Cl.[7] ............................................... G11C 7/00
(52) U.S. Cl. ............................ 365/189.05; 365/189.04; 365/230.04; 365/230.06
(58) Field of Search ....................... 365/230.04, 230.06, 365/230.03, 189.04, 189.05, 205, 208, 233

(56) References Cited

U.S. PATENT DOCUMENTS

| | | | |
|---|---|---|---|
| 5,289,421 A | * 2/1994 | Lee et al. ................... | 365/206 |
| 5,815,444 A | * 9/1998 | Ohta ........................ | 365/189.05 |
| 6,166,942 A | * 12/2000 | Vo et al. ..................... | 365/63 |
| 6,594,195 B2 | * 7/2003 | Chen ...................... | 365/230.04 |
| 2002/0051378 A1 | 5/2002 | Ohsawa | |

OTHER PUBLICATIONS

T. Ohsawa, et al., ISSCC Paper Continuations, 3 pages, "Memory Design Using One–Transistor Gain Cell on SOI", 2002.

K. Itoh, VLSI Memory, pp. 96–101, "Basic Structure of Chip and Address Signal Multiplexed Method" (with English translation).

* cited by examiner

*Primary Examiner*—Gene Auduong
(74) *Attorney, Agent, or Firm*—Oblon, Spivak, McClelland, Maier & Neustadt, P.C.

(57) ABSTRACT

A semiconductor memory device has a memory cell array which includes memory cells arranged in a matrix form, word lines, bit lines, a decoding circuit and sense unit. The decoding circuit is supplied with an address signal and a first control signal and drives a selected word line which is the word line specified by the address signal or an adjacent word line which is the word line adjacent to the selected word line on the basis of the first control signal. The sense unit is connected to the bit line and reads data stored in the memory cell which is connected to the word line driven by the decoding circuit.

36 Claims, 40 Drawing Sheets

BIT LINE VOLTAGE IN STEP 2 AND STEP 3

| LATCH DATA | L1 | 0 | 0 | 1 | 1 |
|---|---|---|---|---|---|
| | L2 | 0 | 1 | 0 | 1 |
| BIT LINE VOLTAGE | Step2 | -1V | float (0.2V) | float (0.2V) | float (0.2V) |
| | Step3 | float (-1V) | -1V | 1.5V | 1.5V |

FIG.8

BIT LINE VOLTAGE IN STEPS 3, 4, AND 5

| LATCH DATA | L1 | 0 | 0 | 1 | 1 |
|---|---|---|---|---|---|
| | L2 | 0 | 1 | 0 | 1 |
| BIT LINE VOLTAGE | Step3 | float (0.2V) | -1V | 1.5V | 1.5V |
| | Step4 | -1V | float (0V) | float (0V) | float (0V) |
| | Step5 | float (0V) | 1.5V | -1V | 1.5V |

FIG.10

BIT LINE VOLTAGE IN STEP 2

| LATCH DATA | L1 | 0 | 0 | 1 | 1 |
|---|---|---|---|---|---|
| | L2 | 0 | 1 | 0 | 1 |
| BZ | | "H" | "L" | "L" | "L" |
| BIT LINE VOLTAGE | | -1V | -1V | 1.5V | 1.5V |

FIG.17

BIT LINE VOLTAGE IN STEPS 3 AND 4

| LATCH DATA | L1 | 0 | 0 | 1 | 1 |
|---|---|---|---|---|---|
|  | L2 | 0 | 1 | 0 | 1 |
| BZ | | "H" | "L" | "L" | "L" |
| BIT LINE VOLTAGE | Step3 | -1V | -1V | 1.5V | 1.5V |
|  | Step4 | -1V | 1.5V | -1V | 1.5V |

FIG.19

BIT LINE VOLTAGE IN STEPS 2 AND 3

| LATCH DATA | L1 | 0 | 0 | 1 | 1 |
|---|---|---|---|---|---|
| | L2 | 0 | 1 | 0 | 1 |
| BIT LINE VOLTAGE | Step2 | -1V | -1V | 1.5V | 1.5V |
| | Step3 | -1V | float (0V) | -1V | float (0V) |

FIG.27

BIT LINE VOLTAGE IN STEPS 3, 4, AND 5

| LATCH DATA | L1 | 0 | 0 | 1 | 1 |
|---|---|---|---|---|---|
| | L2 | 0 | 1 | 0 | 1 |
| BIT LINE VOLTAGE | Step3 | 1.5V | 1.5V | 1.5V | 1.5V |
| | Step4 | -1V | -1V | 1.5V | 1.5V |
| | Step5 | -1V | float (0V) | -1V | float (0V) |

FIG.29

SEMICONDUCTOR MEMORY DEVICE AND METHOD OF CONTROLLING THE SAME

CROSS REFERENCE TO RELATED APPLICATION

This application claims benefit of priority under 35 U.S.C. §119 to Japanese Patent Application No. 2002-272022, filed on Sep. 18, 2002, the entire contents of which are incorporated by reference herein.

BACKGROUND OF THE INVENTION

1. Field of the Invention

The present invention relates to a semiconductor memory device and a method of controlling the same, and particularly relates to an FBC (Floating Body Cell) structured semiconductor memory device and a method of controlling the same.

2. Related Background Art

An FBC memory is a volatile memory which can be formed on an SOI substrate and expected as a semiconductor memory device which replaces DRAMs. The FBC memory has an advantage of being suitable for high-density integration because of its small cell size. The basic explanation of this FBC memory is disclosed, for example, in document 1 (T. Ohsawa et al., "Memory Design Using One-Transistor Gain Cell on SOI", ISSCC Digest of Technical Papers, pp152–153, 2002).

FIG. 30 is a plane layout of a memory cell array portion of the FBC memory, FIG. 31 is a sectional view taken along the line A–A' of the memory cell array in FIG. 30, FIG. 32 is a sectional view taken along the line B–B' of the memory cell array in FIG. 30, and FIG. 33 is a sectional view taken along the line C–C' of the memory cell array in FIG. 30. FIG. 34 is a circuit diagram showing an equivalent circuit of this memory cell array.

As can be seen from these drawings, the FBC memory uses MIS transistors (Metal-Insulator-Semiconductor transistors) arranged in a matrix form on the SOI substrate as memory cells MC. In an example shown in these drawings, the SOI substrate includes an N$^+$-type diffusion layer 12 formed on a P-type semiconductor substrate 10 and an insulating film (a silicon oxide film, for example) 14 formed on the diffusion layer 12. Moreover, this memory cell array includes a plurality of word lines WL extending in a first direction, a plurality of source lines SL extending also in the first direction, and a plurality of bit lines BL extending in a second direction which intersects the first direction.

A drain 20 of the memory cell MC is connected to the bit line BL via a bit line contact 21, a source 22 is connected to the source line SL, and a gate electrode 24 constitutes the word line WL. A portion between the drain 20 and the source 22 is electrically in a floating state and forms a channel body 28. The aforementioned gate electrode 24 is located above this channel body 28 with a gate insulating film 26 therebetween. The source line SL is always fixed to 0 V.

The drain 20 and the source 22 of the memory cell MC are formed by an N-type semiconductor layer, and the channel body 28 is formed by a P-type semiconductor layer. The memory cell MC stores data depending on whether or not holes which are majority carriers are accumulated. Hereafter, a state in which holes are accumulated in the channel body 28 is defined as "1" and a state in which holes are not accumulated therein is defined as "0".

N$^+$-type polysilicon pillars 30 shown in FIG. 32 and FIG. 33 are each an electrode formed to maintain the accumulation state of holes. Namely, the polysilicon pillar 30 and the channel body 28 form capacitance, and by applying negative voltage to the polysilicon pillar 30, the accumulation state of holes can be maintained for a longer time. However, the holes accumulated in the channel body 28 come off the channel body 28 after a lapse of a sufficiently long time because of leakage from a PN junction portion which exists in the drain 20 and the source 22. Therefore, it is necessary to execute a data refresh in the FBC memory likewise with the DRAM.

Next, the operational principle of the FBC structured memory cell MC will be explained. When data "1" is written into the FBC structured memory cell MC, as shown in FIG. 35, for example, 1.5 V is applied to the word line WL and 1.5 V is applied to the bit line BL. Since a transistor composing the memory cell MC operates in a saturation region, holes are generated by impact ionization. The generated holes move to the lower side of the channel body 28 and they are accumulated in the capacitance.

When data "0" is written, as shown in FIG. 36, for example, 1.5 V is applied to the word line WL and −1 V is applied to the bit line BL. Thereby, the PN junction of the drain 20 is forward biased, and holes are emitted to the bit line BL.

When data is read, as shown in FIG. 37, for example, 1.5 V is applied to the word line WL, 0.2 V is applied to the bit line BL, and the transistor composing the memory cell MC is turned on. Thresholds of the transistor when holes are accumulated in the channel body 28 and when holes are not accumulated therein are different because of a back bias effect. Accordingly, as shown in FIG. 38, the current characteristic of the transistor varies according to data. By detecting this difference in current, data can be read. Since the voltage of the bit line BL is low when data is read, the transistor of the memory cell MC operates in a linear region. Hence, impact ionization does not occur. Consequently, holes are not generated, and data in the memory cell MC is not destroyed. Namely, in the FBC structured memory cell MC, non-destructive read-out of data is possible.

Note that, in the non-selected memory cell MC in the memory cell array, −1.5 V is applied to the word line WL and 0 V is applied to the bit line BL.

Next, the entire configuration of a semiconductor memory device is explained which uses the memory cell array of the FBC memory. FIG. 39 is a layout showing the configuration of such a semiconductor memory device. The FBC memory aims at replacing the DRAM, and therefore, similarly to the DRAM, it performs address signal multiplexing by a /RAS signal and a /CAS signal. An art regarding this address signal multiplexing is disclosed, for example, in document 2 (Kiyoo Itoh, "VLSI Memory", Baifukan, p97, 1995).

As shown in FIG. 39, a memory cell array 100 includes the memory cells MC with the aforementioned configuration, a row decoder 102 is provided on one end side in a word line WL direction thereof, and a bit line selector 104 is provided on one end side in a bit line BL direction thereof.

An address signal inputted from an ADDRESS terminal is inputted to a row address buffer 110 and a column address buffer 112. The row address buffer 110 sends out the inputted address signal (which is a row address signal) to a predecoder 120 based on the /RAS signal, and the row address signal is inputted to the row decoder 102 via the predecoder 120. The row decoder 102 selects the word line WL based on the row address signal.

Meanwhile, the column address buffer 112 sends out the inputted address signal (which is a column address signal) to the bit line selector 104 based on the /CAS signal. The bit line selector 104 selects the bit line BL based on the column address signal, and connects the selected bit line BL to a sense unit 130.

Program data is inputted from a DIN pad to this semiconductor memory device and sent out to the sense unit 130 via a data input buffer 140. On the other hand, read data sensed in the sense unit 130 is outputted to the outside of this semiconductor memory device from a DOUT pad via a data output buffer 150 and an off-chip driver 152. Inside the semiconductor memory device, in addition to these, a controller 160 for generating various control signals and a voltage generating circuit 162 for generating various internal voltages are provided.

A plurality of sense units 130 are connected to the bit line selector 104. FIG. 40 is a diagram showing a circuit configuration of one sense unit 130 and circuit configurations of its related circuits. As shown in FIG. 40, the one sense unit 130 includes a sense amplifier 200, a latch circuit 202, and an MIS transistor Tr200.

The sense amplifier 200 detects a cell current read from the memory cell MC by monitoring a current flowing through the bit line BL, and outputs "1" or "0" data depending on the value of the cell current. When a control signal SAEN is high, the sense amplifier 200 is activated and brought into an enable state.

The latch circuit 202 includes two inverters IN200 and IN202. A logic symbol with a square inversion symbol is 1.5 V at a high level and –1 V at a low level. This is also applied to the following explanations.

The sense unit 130 is connected to one bit line BL via the bit line selector 104. An MIS transistor Tr202 for reset is provided in each bit line BL. A BLRST signal is high except during a read sequence, a write sequence, and a refresh sequence, and the bit line BL is grounded at 0 V via the MIS transistor Tr202.

A data input line D connected to the data input buffer 140 is connected to the latch circuit 202 via an MIS transistor Tr210 and the MIS transistor Tr200. Hence, when a WCSL signal and an SAON signal go high, these MIS transistor Tr210 and the MIS transistor Tr200 are turned on, and data in the data input line D can be captured by the latch circuit 202.

A data output line Q connected to the data output buffer 150 is connected to an output terminal of the inverter IN202 in the latch circuit 202 via an MIS transistor Tr220 and an MIS transistor Tr222, and similarly a data output line /Q connected to the data output buffer 150 is connected to an output terminal of the inverter IN200 in the latch circuit 202 via an MIS transistor Tr230 and an MIS transistor Tr232. Hence, it becomes possible to send out data latched by the latch circuit 202 to the data output lines Q and /Q when an RCS signal goes high.

Next, operational waveforms in the read sequence, the write sequence, and the refresh sequence in the aforementioned semiconductor memory device will be explained briefly. FIG. 41 is a diagram showing operational waveforms in the read sequence, FIG. 42 is a diagram showing operational waveforms in the write sequence, and FIG. 43 is a diagram showing operational waveforms in the refresh sequence.

As shown in FIG. 41, in the read sequence, after data sensed by the sense amplifier 200 is inputted to the latch circuit 202, the RCS signal goes high, and data which has been read is transferred to the data output buffer 150 via the data output lines Q and /Q. Note that, when an LTC signal inputted to the latch circuit 202 is high, this latch circuit 202 is in a data capture state, and when the LTC signal is low, the latch circuit 202 is in a hold state.

As shown in FIG. 42, in the write sequence, program data is inputted to the latch circuit 202, the program data is then sent out to the bit line BL, and a write into the memory cell MC is performed.

As shown in FIG. 43, in the refresh operation, data in the memory cell MC is read by the sense amplifier 200 and latched by the latch circuit 202. Subsequently, the latched data is written again into the memory cell MC. The memory cell MC to be refreshed is selected based on a refresh address signal generated by the controller 160. This refresh address signal includes a row address signal and a column address signal. More specifically, the controller 160 selects one word line WL based on one row address signal, and refreshes all of the memory cells MC connected to this word line WL while incrementing the column address. Thereafter, it increments the row address signal and refreshes all of the memory cells MC connected to the next word line WL. Thus, the controller 160 performs control in such a manner that all of the memory cells are refreshed within a predetermined time interval.

The aforementioned FBC structured memory cell MC, however, has the following problems. Namely, as shown in FIG. 44, when the memory cell MC holding "1" data and the memory cell MC holding "0" data share the drain 20, a situation in which the memory cell MC holding the "1" data (hereinafter referred to as a selected cell) is selected and "0" data is written thereinto is assumed. In such a situation, holes accumulated in the selected cell are emitted to the bit line BL via the drain 20, but part of holes which are originally to be emitted to the bit line BL get into the channel body 28 of the adjacent memory cell MC (hereinafter referred to as an adjacent cell) through the drain 20. This is a phenomenon which occurs because the N-type drain 20 connected to the bit line BL and the P-type channel bodies 28 located on its both sides compose a PNP bipolar transistor. Such a phenomenon is hereinafter called "0" disturb.

Most of holes which come off the selected cell are emitted to the bit line BL or recombined to electrons in the N-type drain 20, and thus it can be said that the percentage of holes which get into the channel body 28 of the adjacent cell is low. Accordingly, data in the adjacent cell does not change from "0" to "1" by a single "0" disturb. However, if the "1" data and the "0" data are alternately written into the selected cell, and this "0" disturb repeatedly occurs, the data in the adjacent cell is changed from "0" to "1".

In the FBC structured memory cell MC, there is another disturb. As shown in FIG. 45, a case where the "1" data is written into the selected cell is assumed. It is supposed that the adjacent cell which shares the source 22 with the selected cell holds the "0" data. Holes are continuously generated by impact ionization while the "1" data is written into the selected cell, but there is a limit to the quantity of holes to be accumulated in the channel body 28. Hence, if the state in which the "1" data is written into the selected cell continues for a long time, excess holes are emitted to the source 22. Part of holes flowing into the source 22 further flow into the channel body 28 of the adjacent cell. Such a phenomenon is hereinafter called "1" disturb.

If this "1" disturb is repeated, the data in the adjacent cell is destroyed. This "1" disturb occurs even when the selected cell before write operation holds the "1" data and even when it holds the "0" data.

SUMMARY OF THE INVENTION

In order to accomplish the aforementioned and other objects, according to one aspect of the present invention, a semiconductor memory device comprises:

a memory cell array which includes a plurality of memory cells arranged in a matrix form, each of the memory cells including a transistor which has a source, a drain and a channel body between the source and the drain, each of the memory cells storing data depending on whether or not majority carriers are accumulated in the channel body;

a plurality of word lines, each of which is connected to gate electrodes of the memory cells arranged in a first direction;

a plurality of bit lines, each of which is connected to the memory cells arranged in a second direction which intersects the first direction and configured to read data stored in the memory cells;

a decoding circuit which is supplied with an address signal and a first control signal, the decoding circuit driving a selected word line which is the word line specified by the address signal or an adjacent word line which is the word line adjacent to the selected word line on the basis of the first control signal; and a sense unit which is connected to a bit line and reads data stored in the memory cell which is connected to the word line driven by the decoding circuit.

According to another aspect of the present invention, a method of controlling a semiconductor memory device includes:

a memory cell array which includes a plurality of memory cells arranged in a matrix form, each of the memory cells including a transistor which has a source, a drain and a channel body between the source and the drain, each of the memory cells storing data depending on whether or not majority carriers are accumulated in the channel body;

a plurality of word lines, each of which is connected to gate electrodes of the memory cells arranged in a first direction; and a plurality of bit lines, each of which is connected to the memory cells arranged in a second direction which intersects the first direction and configured to read data stored in the memory cells, and the method comprises:

acquiring an address signal;

acquiring a first control signal;

driving a selected word line which is the word line specified by the address signal or an adjacent word line which is the word line adjacent to the selected word line on the basis of the first control signal; and reading data stored in the memory cell which is connected to the driven word line, via the bit line.

BRIEF DESCRIPTION OF THE DRAWINGS

FIG. 8 is a diagram showing the contents of data latched by latch circuits and bit line voltage in Step 2 and Step 3 in the write sequence in the semiconductor memory device according to the first embodiment in tabular form;

FIG. 10 is a diagram showing the contents of data latched by the latch circuits and bit line voltage in Step 3, Step 4, and Step 5 in the refresh sequence in the semiconductor memory device according to the first embodiment in tabular form;

FIG. 17 is a diagram showing the contents of data latched by latch circuits, the content of a BZ signal, and bit line voltage in Step 2 in the write sequence in the semiconductor memory device according to the second embodiment in tabular form;

FIG. 19 is a diagram showing the contents of data latched by the latch circuits, the content of the BZ signal, and bit line voltage in Step 3 and Step 4 in the refresh sequence in the semiconductor memory device according to the second embodiment in tabular form;

FIG. 27 is a diagram showing the contents of data latched by latch circuits and bit line voltage in Step 2 and Step 3 in the write sequence in the semiconductor memory device according to the fourth embodiment in tabular form;

FIG. 29 is a diagram showing the contents of data latched by the latch circuits and bit line voltage in Step 3, Step 4, and Step 5 in the refresh sequence in the semiconductor memory device according to the fourth embodiment in tabular form;

DESCRIPTION OF THE PREFERRED EMBODIMENTS (First Embodiment)

In the first embodiment, to write data into a selected cell, data in an adjacent cell which is a memory cell MC sharing a bit line with the selected cell and located adjacent thereto is read beforehand, and when both the read data and the program data are "0", "0" data is written into both the selected cell and the adjacent cell, and in cases other than this one, the data is written into only the selected cell. As a result, the memory cell MC is not adversely affected by "0" disturb. In this embodiment, the influence of "1" disturb is regarded as small or regarded as being able to be avoided in some way.

Figure 1:
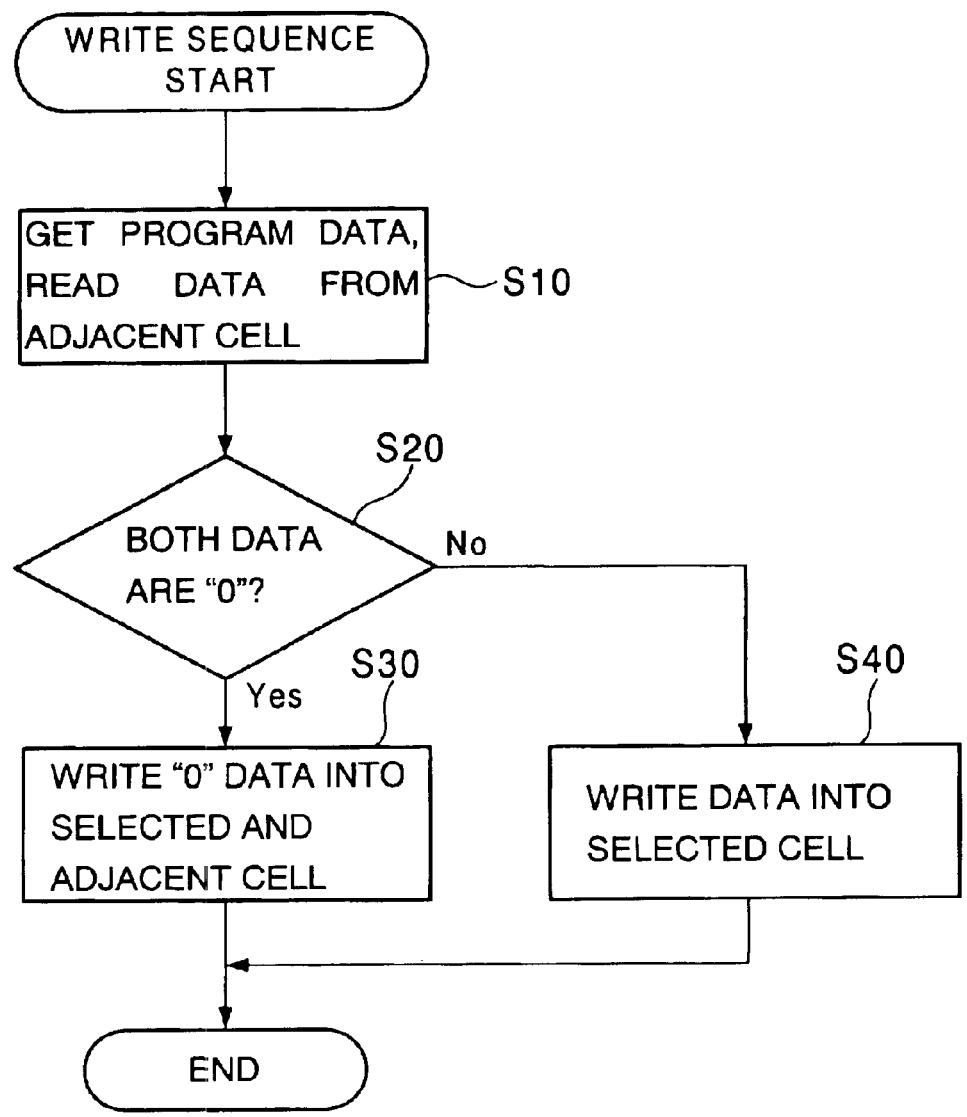
FIG. 1 is a flowchart for explaining the processing content of a write sequence in a semiconductor memory device according to a first embodiment.
Figure 2:
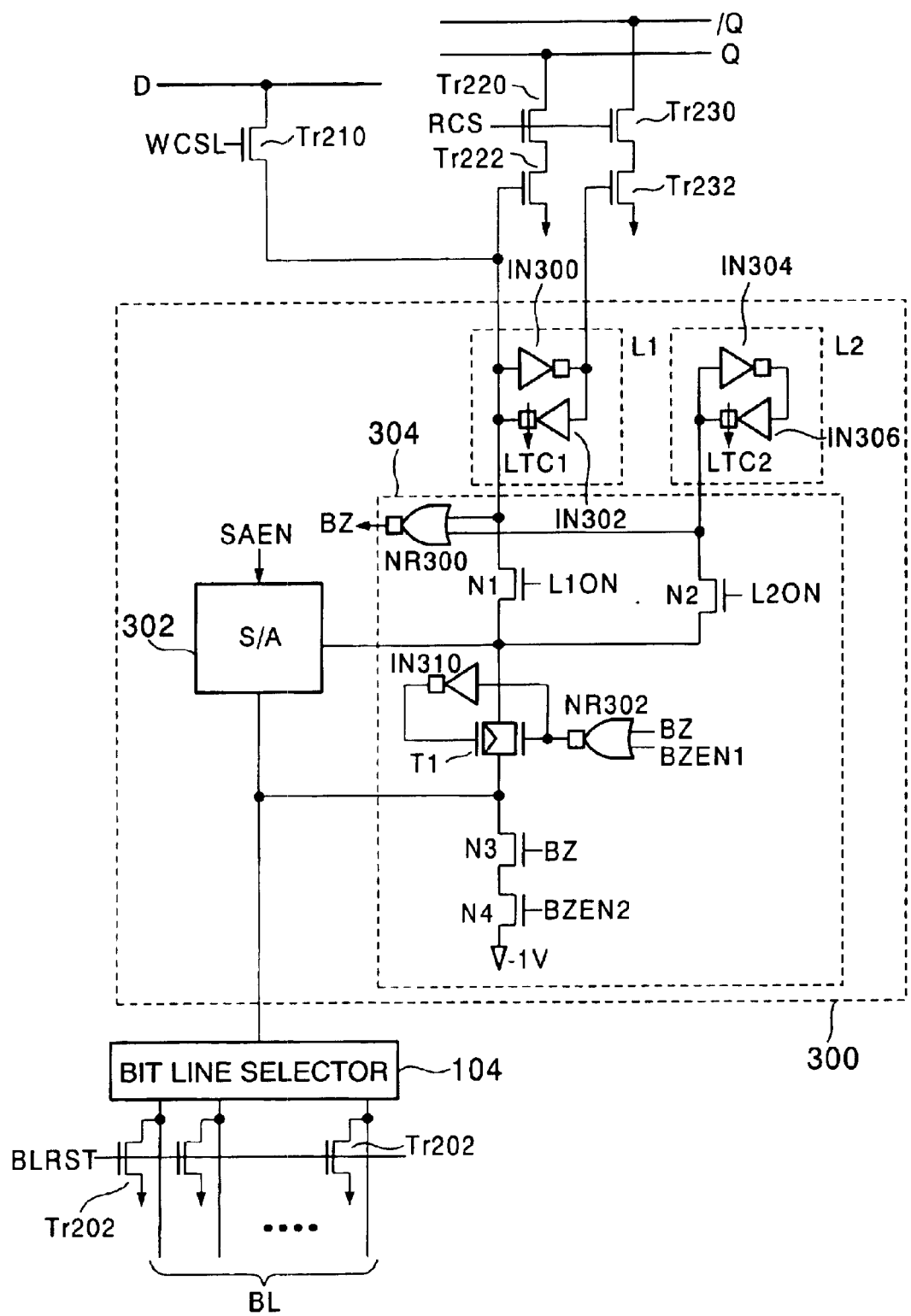
FIG. 2 is a diagram showing a circuit configuration of a sense unit according to the first embodiment and its peripheral circuit configurations.

FIG. 1 is a flowchart explaining a write sequence in a semiconductor memory device according to this embodiment, and FIG. 2 is a diagram showing a circuit configuration of a sense unit 300 according to this embodiment and its peripheral circuit configurations.

Figure 39:
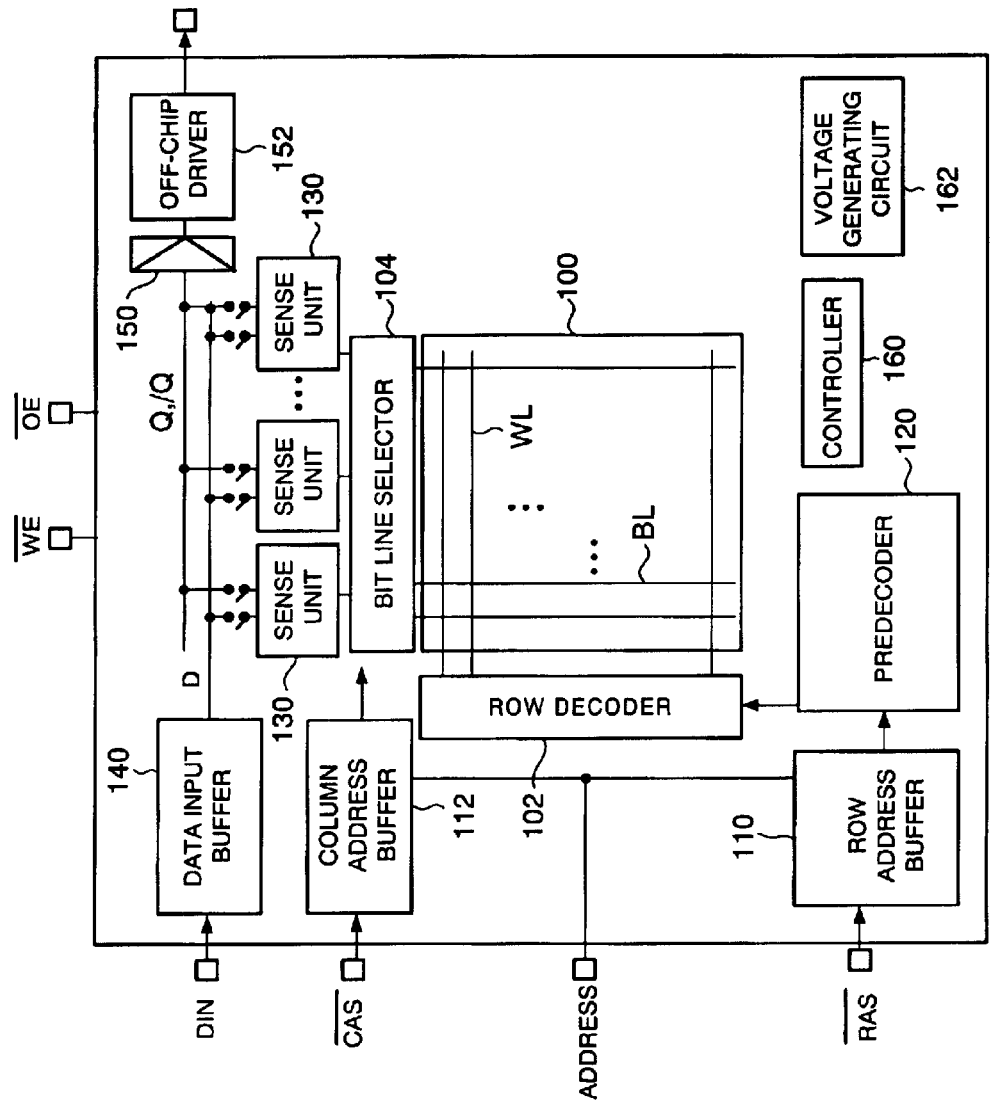
FIG. 39 is a diagram showing a chip layout of a semiconductor memory device including the memory cell array in FIG. 30.

The sense unit 300 according to this embodiment shown in FIG. 2 is a circuit which corresponds to a sense unit 130 in FIG. 39. Namely, a basic layout of the semiconductor memory device in this embodiment is the same as that in FIG. 39. As shown in FIG. 2, the sense unit 300 includes two latch circuits L1 and L2, a sense amplifier 302, and a control circuit 304.

The latch circuit L1 includes inverters IN300 and IN302, and the latch circuit L2 includes inverters IN304 and In306. In the write sequence, program data to be written into the selected cell is stored in the latch circuit L1, and data read from the adjacent cell is stored in the latch circuit L2.

The sense amplifier 302 reads data in the memory cell MC from a bit line BL selectively connected by a bit line selector 104. In other words, the sense amplifier 302 monitors a cell current flowing through the bit line BL, and based on the value of the cell current, senses whether the memory cell MC is in a state of holding "0" data or in a state of holding "1" data. The sense amplifier 302 then outputs a low-level signal to the control circuit 302 when the sensed data is "0" data and outputs a high-level signal to the control circuit 304 when the sensed data is "1" data.

The control circuit 304 is a circuit that controls the operations of these latch circuits L1 and L2 and the sense amplifier 302 and voltage to be supplied to the bit line BL. This control circuit 304 includes an inverter IN310, NOR circuits NR300 and NR302, a transfer gate T1, and N-type MIS transistors N1 to N4.

More specifically, an output terminal of the inverter IN302 of the latch circuit L1 is connected to a first input terminal of the NOR circuit NR300 and a first terminal of the MIS transistor N1. An output terminal of the inverter IN306 of the latch circuit L2 is connected to a second input terminal of the NOR circuit NR300 and a first terminal of the MIS transistor N2. Moreover, a BZ signal is outputted from an output terminal of the NOR circuit NR300.

An L1ON signal is inputted to a gate terminal of the MIS transistor N1, and an L2ON signal is inputted to a gate terminal of the MIS transistor N2. A second terminal of the MIS transistor N1 and a second terminal of the MIS transistor N2 are connected to the sense amplifier 302 and a first terminal of the transfer gate T1. The aforementioned BZ signal is inputted to a first input terminal of the NOR circuit NR302, and a BZEN1 signal is inputted to a second input terminal thereof. An output signal of this NOR circuit NR302 is inputted to a gate terminal of an N-type MIS transistor of the transfer gate T1, and concurrently inverted by the inverter IN310 and inputted to a gate terminal of a P-type MIS transistor of the transfer gate T1.

A second terminal of the transfer gate T1 is connected to the bit line selector 104 and a first terminal of the MIS transistor N3. The BZ signal is inputted to a gate terminal of this MIS transistor N3, and a second terminal thereof is connected to a first terminal of the MIS transistor N4. A BZEN2 signal is inputted to a gate terminal of the MIS transistor N4, and a second terminal thereof is connected to a voltage source which supplies a voltage of −1 V.

In this embodiment, control signals necessary to control this semiconductor memory device are generated by a controller 160 (See FIG. 39). Namely, in FIG. 2, an SAEN signal, the L1ON signal, the L2ON signal, the BZEN1 signal, the BZEN2 signal, a BLRST signal, a WCSL signal, an RCS signal, and other control signals are generated by the controller 160 as necessary.

As shown in FIG. 1, in this embodiment, in the write sequence, data to be written into the selected cell is stored in the latch circuit L1, and data stored in the adjacent cell is read and stored in the latch circuit L2 (step S10). Subsequently, it is determined whether or not both the data in the latch circuit L1 and the data in the latch circuit L2 are "0" data (step S20).

When both are the "0" data (step S20: YES), 1.5 V is applied to both the word lines WL of the selected cell and the adjacent cell, and the "0" data is written into both the selected cell and the adjacent cell (step S30). On the other hand, when at least either of the data stored in the latch circuit L1 or the data stored in the latch circuit L2 is not the "0" data (step S20: No), 1.5 V is applied to only the word line WL of the selected cell, and the data stored in the latch circuit L1 is written into the selected cell (step S40).

Figure 44:
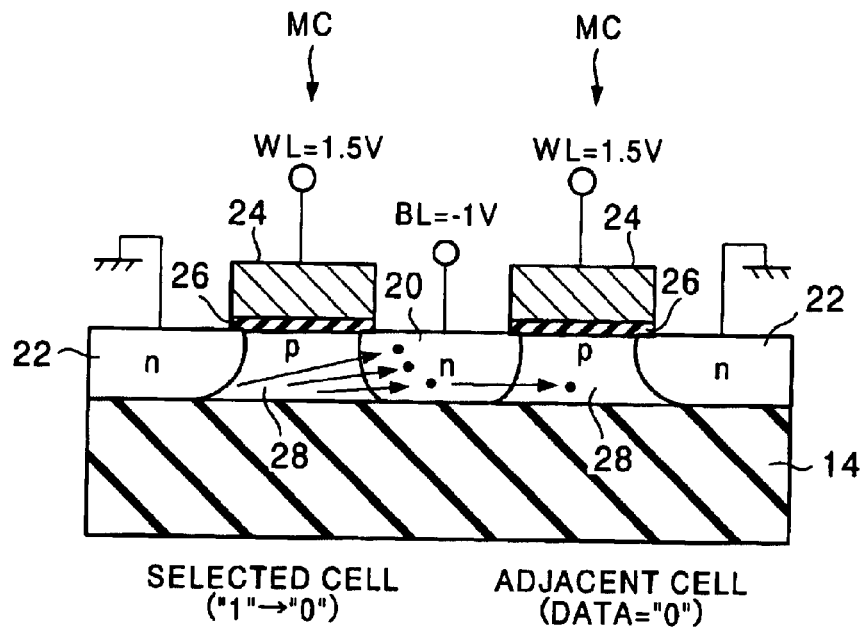
FIG. 44 is a diagram explaining the principle of "0" disturb which occurs between a "selected cell" as a memory cell whose data is to be written into and an "adjacent cell" which shares a bit line with the selected cell and is located adjacent to the selected cell.

Consequently, the destruction of the data in the adjacent cell due to the occurrence of the "0" disturb can be avoided. Namely, by doing this, when the "0" data is written into the selected cell while the adjacent cell is holding the "0" data as shown in FIG. 44, the "0" data is written into both the selected cell and the adjacent cell, whereby the injection of holes into the adjacent cell can be prevented. On the other hand, in cases other than this one, the "0" disturb does not occur, and hence the data to be written has only to be written into only the selected cell. Note that, in this embodiment, the "selected cell" means the memory cell MC into which data is to be written. The "adjacent cell" means the memory cell MC sharing the bit line BL with the selected cell and located adjacent to the selected cell. In other words, the "adjacent cell" means the memory cell MC which shares a bit line contact 21 with the selected cell.

The above is a summary of this embodiment, and a concrete configuration and operation to realize this will be explained below in detail.

Figure 3:
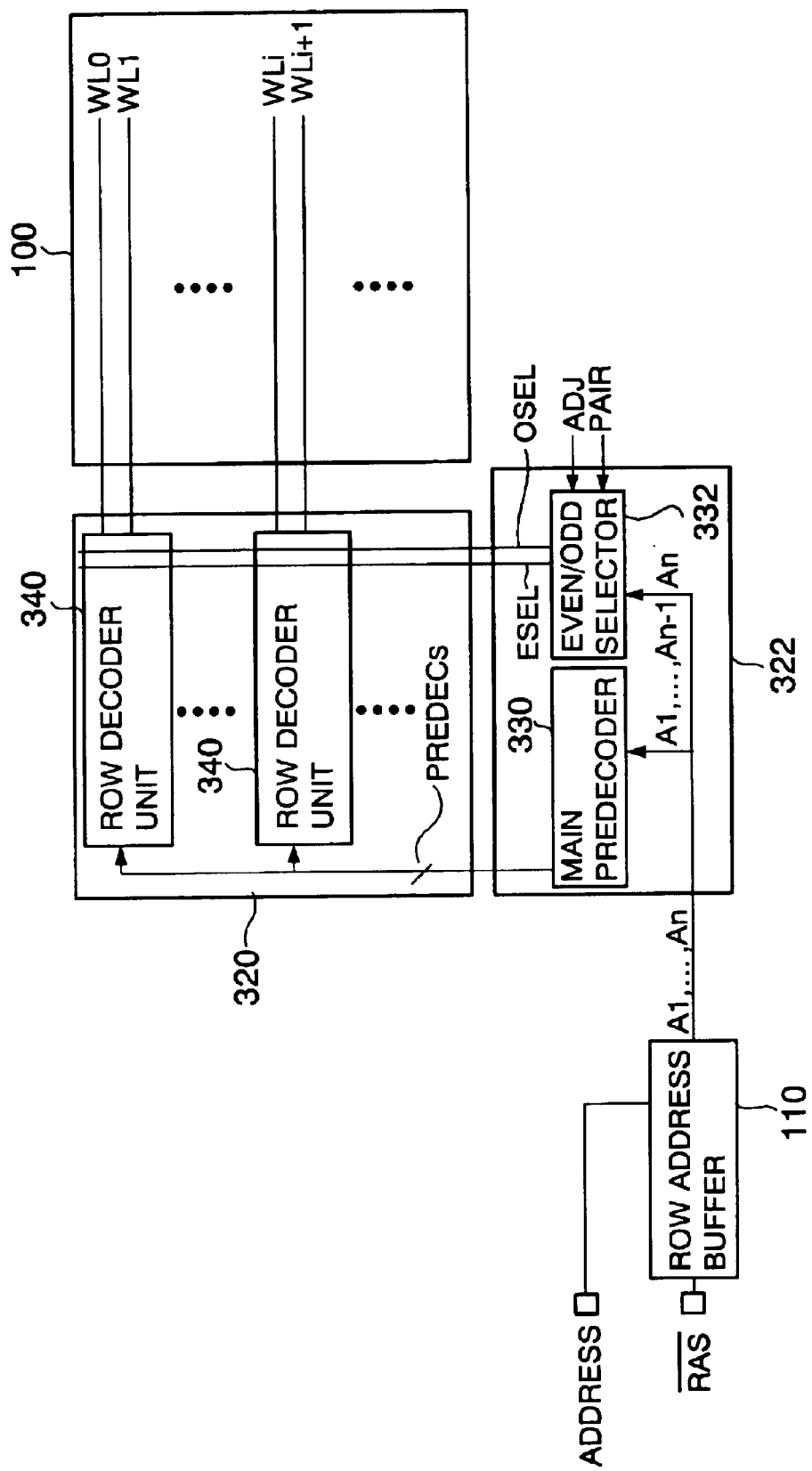
FIG. 3 is a block diagram showing configurations of a row decoder and a predecoder according to the first embodiment.

FIG. 3 is a block diagram showing configurations of a row decoder 320 and a predecoder 322 according to this embodiment. The row decoder 320 is a circuit corresponding to a row decoder 102 in FIG. 39, and the predecoder 322 is a circuit corresponding to a predecoder 120 in FIG. 39.

As shown in FIG. 3, the predecoder 322 according to this embodiment includes a main predecoder 330 and an even/odd selector 332. A row address signal inputted from an ADDRESS terminal is inputted to this predecoder 322 via a row address buffer 110.

Supposing that respective bits of the row address signal composed of n bits are taken as A1, A2, . . . , An, where the last bit An determines even/odd of the word lines. Therefore, the bit An is inputted to the even/odd selector 332. The bits other than this one, A1, A2, . . . , An−1, are inputted to the main predecoder 330.

The main predecoder 330 outputs a PREDECs signal based on the bits A1, A2, . . . , An−1 of the row address signal. An ADJ signal and a PAIR signal are also inputted to the even/odd selector 332, and based on these ADJ signal and PAIR signal and the bit An of the row address, the even/odd selector 332 outputs an ESEL signal and an OSEL signal.

In the row decoder 320, one row decoder unit 340 is provided for each pair of word lines. Namely, one row decoder unit 340 is provided for one even-numbered word line WL and one odd-numbered word line WL. The PREDECs signal outputted from the main predecoder 330 and the ESEL signal and the OSEL signal outputted from the even/odd selector 332 are inputted to each of these row decoder units 340.

The row decoder 320 and predecoder 322 thus configured operate in the following manner. When both the ADJ signal and the PAIR signal are low, the word line WL specified by the row address signal A1, A2, . . . , An is selected. Namely, the word line (selected word line) WL of the selected cell is selected.

When the ADJ signal is high and the PAIR signal is low, the word line (adjacent word line) WL of the adjacent cell which shares the bit line contact 21 with the selected cell is selected. When the PAIR signal is high, both the selected word line WL to which the selected cell is connected and the adjacent word line WL to which the adjacent cell is connected are selected.

Figure 4:
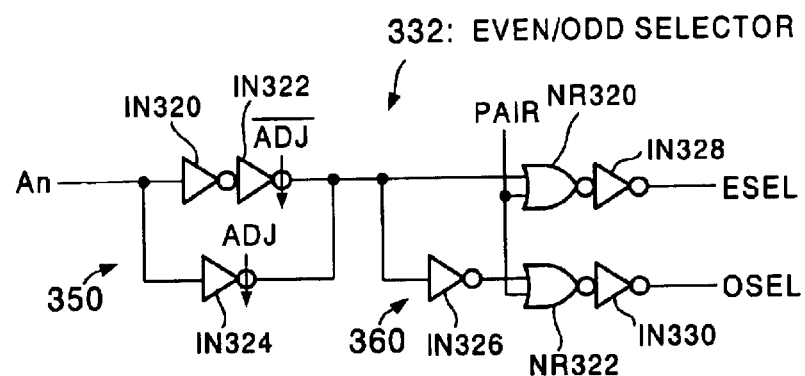
FIG. 4 is a logic circuit diagram explaining a configuration of an even/odd selector according to the first embodiment.
Figure 5:
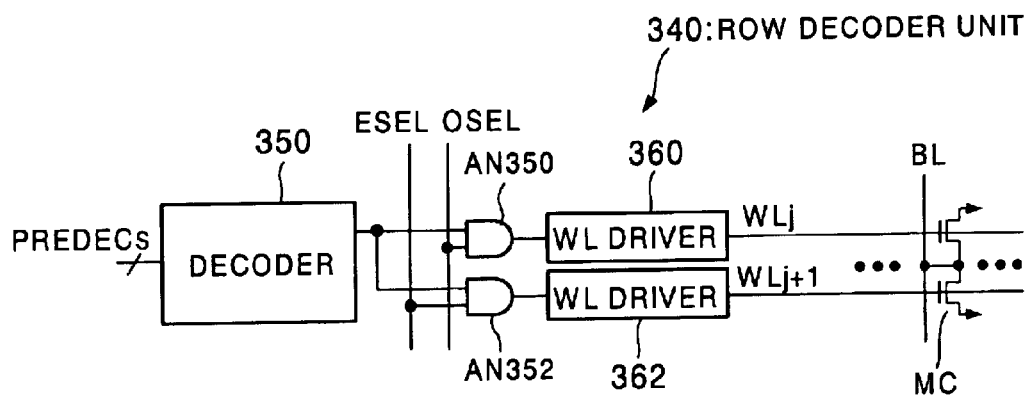
FIG. 5 is a block diagram explaining a configuration of a row decoder unit according to the first embodiment.

FIG. 4 is a diagram showing a circuit configuration of the even/odd selector 332 according to this embodiment, and FIG. 5 is a diagram showing a configuration of the row decoder unit 340 according to this embodiment.

As shown in FIG. 4, the even/odd selector 332 includes an inversion circuit 350 and a simultaneous selection circuit 360. The inversion circuit 350 includes inverters IN320, IN322, and IN324, and the simultaneous selection circuit 360 includes inverters IN326, IN328, and IN330, and NOR circuits NR320 and NR322.

The bit An is inputted to the inverter IN320 and the inverter IN324. When a /ADJ signal inputted to the inverter IN322 is high, the bit An is outputted as it is from the inversion circuit 350 and inputted to the NOR circuit NR320 and the inverter IN326. On the other hand, when the ADJ signal inputted to the inverter IN324 is high, the bit An is inverted, outputted from the inversion circuit 350, and inputted to the NOR circuit NR320 and the inverter IN326.

The signal inputted to the inverter IN326 is inputted to the NOR circuit NR322. The PAIR signal is also inputted to the NOR circuits NR 320 and NR322. Accordingly, when the PAIR signal is low, if the output of the inversion circuit 350 is high, the high-level ESEL signal is outputted from the inverter IN328, and the low-level OSEL signal is outputted from the inverter IN330. On the other hand, if the output of the inversion circuit 350 is low, the low-level ESEL signal is outputted from the inverter IN328, and the high-level OSEL signal is outputted from the inverter IN330.

Contrary to this, when the PAIR signal is high, irrespective of the output of the inversion circuit 350, the high-level ESEL signal is outputted from the inverter IN328, and the high-level OSEL signal is outputted from the inverter IN330.

As shown in FIG. 5, the row decoder unit 340 includes a decoder 350, AND circuits AN350 and AN352, and word line drivers 360 and 362. The PREDECs signal from the main predecoder 330 is inputted to the decoder 350. By this PREDECs signal, the decoder 350 of one row decoder unit 340 is selected out of the plural row decoder units 340, and a high-level signal is outputted from the selected decoder 350. In other words, based on the PREDECs signal, a pair of word lines are specified.

The signal outputted from the decoder 350 is inputted to the AND circuits AN350 and AN352. The OSEL signal is also inputted to the AND circuit AN350, and the ESEL signal is also inputted to the AND circuit AN352. Therefore, in the selected row decoder unit 340, if the OSEL signal is high, the AND circuit AN350 outputs a high-level signal, and thereby the word line driver 360 drives a word line WLj. On the other hand, if the ESEL signal is high, the AND circuit AN352 outputs a high-level signal, and thereby the word line driver 362 drives a word line WLj+1.

By configuring the row decoder 320 and the predecoder 322 as described above, the aforementioned selection of the selected word line WL and the adjacent word line WL to which the selected cell and the adjacent cell are connected respectively becomes possible. Namely, when both the ADJ signal and the PAIR signal are low, the OSEL signal goes high when the bit An is "0", and thereby the word line driver 360 of the selected row decoder unit 340 is driven. When the bit An is "1", the ESEL signal goes high, and thereby the word line driver 362 of the selected row decoder unit 340 is driven. Consequently, the word line WL designated by the row address signal A1, A2, . . . , An is selected.

When the ADJ signal is high and the PAIR signal is low, the ESEL signal goes high when the bit An is "0", and thereby the word line driver 362 of the selected row decoder unit 340 is driven. When the bit An is "1", the OSEL signal goes high, and thereby the word line driver 360 of the selected row decoder unit 340 is driven. Consequently, the other word line WL paired with the word line WL designated by the row address signal A1, A2, . . . , An is selected.

When the PAIR signal is high, both the ESEL signal and the OSEL signal become high irrespective of whether the bit An is "0" or "1". Therefore, both the word line drivers 360 and 362 provided in the row decoder unit 340 selected by the row address signal A1, A2, . . . , An−1 are driven. As a result, both of the pair of word lines designated by the row address signal A1, A2, . . . , An−1 are selected.

Next, operational waveforms in a read sequence, operational waveforms in the write sequence, and operational waveforms in a refresh sequence will be explained.

Figure 6:
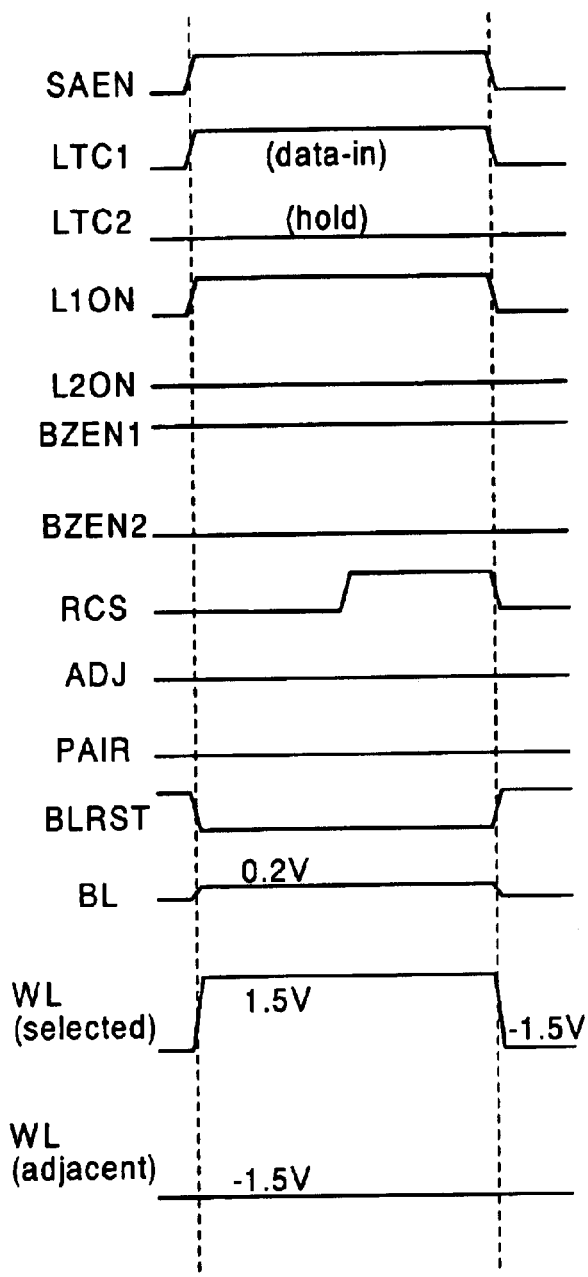
FIG. 6 is a diagram showing operational waveforms in a read sequence in the semiconductor memory device according to the first embodiment.

FIG. 6 is a diagram explaining the operational waveforms in the read sequence. In the read sequence, the latch circuit L2 is not used, and the data in the selected cell is read to the latch circuit L1 in basically the same waveforms as in the related art. Accordingly, the detailed explanation thereof is omitted here.

Figure 7:
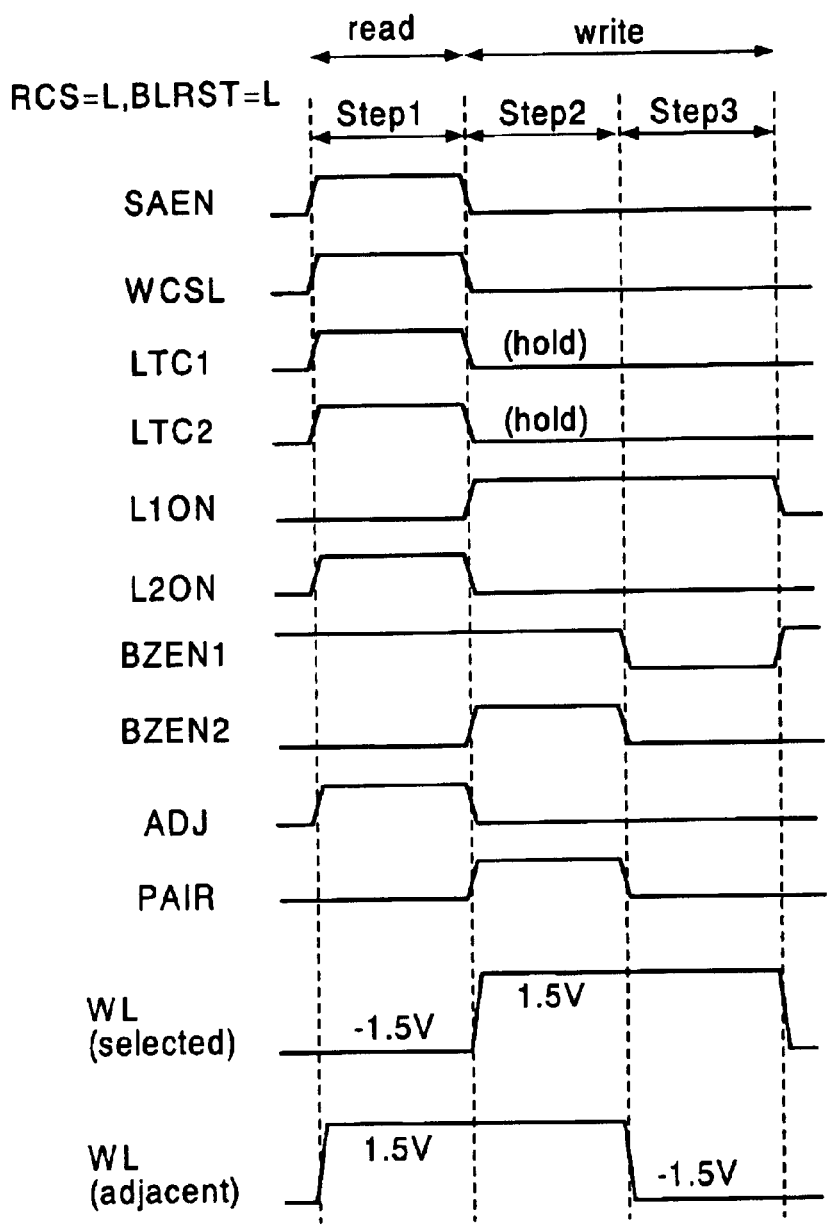
FIG. 7 is a diagram showing operational waveforms in the write sequence in the semiconductor memory device according to the first embodiment.

FIG. 7 is a diagram explaining the operational waveforms in the write sequence, and FIG. 8 is a diagram showing the relation between bit line voltage in Step 2 and Step 3 and latch data in this write sequence in tabular form.

As can be seen from these drawings, the write sequence includes three steps of Step 1 to Step 3. In Step 1, data in the adjacent cell is read and stored in the latch circuit L2, and program data is stored in the latch circuit L1. In Step 2, "0" data write into the selected cell and the adjacent cell when both the data in the latch circuits L1 and L2 are "0" is performed. In Step 3, data write into the selected cell in cases other than this one is performed. Namely, when at least one of the latch circuits L1 and the latch circuit L2 latches the "1" data, the data is written into the selected cell in timing different from the timing in writing the "0" data into both the selected cell and the adjacent cell.

The write sequence is performed in parallel in the sense units 300 provided in the semiconductor memory device. Accordingly, in one write sequence, data can be written into a plurality of memory cells MC (the number of which is the same as that of the sense units 300).

In a more detailed explanation, in Step 1, the WCSL signal and the LTC1 signal go high, and the program data is stored in the latch circuit L1. Moreover, since the ADJ signal is high and the PAIR signal is low, the adjacent word line WL which is the word line WL paired with the selected word line WL selected by the row address signal A1, A2, . . . , An is selected and goes to 1.5 V.

Further, since the BZEN1 is high, the transfer gate T1 is turned off. Since the BZEN2 signal is low, the MIS transistor N4 is turned off. Since the L2ON signal is high, the MIS transistor N2 is turned on. The sense amplifier 302 is activated by the SAEN signal, and hence a current read from the adjacent cell is sensed by the sense amplifier 302, and stored as read data in the latch circuit L2.

In Step 2, the PAIR signal goes high, and thereby both the selected word line WL selected by the row address signal and the adjacent word line WL paired with this selected word line WL go to 1.5 V. Moreover, since outputs of the latch circuit L1 and the latch circuit L2 are inputted to the NOR circuit NR300, only when both of the data stored in the latch circuit L1 and the data stored in the latch circuit L2 are "0" data, the BZ signal which is an output of the NOR circuit NR300 goes high.

When the BZ signal is high, the transfer gate T1 is turned off and the MIS transistor N3 is turned on. Moreover, since the BZEN2 signal is high, the MIS transistor N4 is turned on. Therefore, when the "0" data is held in the latch circuits L1 and L2, −1 V is supplied to the bit line BL via the MIS transistors N3 and N4.

On this occasion, both the selected word line WL to which the selected cell is connected and the adjacent word line WL to which the adjacent cell is connected are at 1.5 V the "0" data is written into the selected cell, and simultaneously the "0" data is written into the adjacent cell.

In some of the plural sense units 300, at least one of the latch circuits L1 and L2 may store "1" data, but in such sense units 300, the aforementioned write in Step 2 is not performed. Namely, since the BZ signal is low, the MIS transistor N3 is turned off. Moreover, since the BZEN1 signal is high, the transfer gate T1 is also turned off. Accordingly, the bit line BL is brought into a floating state, and hence the write into the selected cell and the adjacent cell is not performed.

Note that, it is possible that there exists no sense unit 300 in which both the latch circuits L1 and L2 hold the "0" data. In such a case, write is not performed in all the sense units 300, but since the time required for the write into the memory cell MC is short, overhead is considered to be small with respect to the whole time in the write.

In Step 3, the ADJ signal is low and the PAIR signal goes low, only the word line WL specified by the row address signal A1, A2, . . . , An is selected and held at 1.5 V. Since the BZEN1 signal goes low, the transfer gate T1 is turned on when the BZ signal is low (at least one of the latch circuits L1 and L2 holds the "1", data). Moreover, when the BZ signal is low, the MIS transistor N3 is turned off. Since the L1ON signal is high, the MIS transistor N1 is turned on. Hence, the data stored in the latch circuit L1 is supplied to the bit line BL. In other words, a voltage of −1 V is supplied to the bit line BL when the latch circuit L1 holds the "0" data, and a voltage of 1.5 V is supplied to the bit line BL when the latch circuit L1 holds the "1" data.

On the other hand, when both the latch circuits L1 and L2 hold the "0" data, the BZ signal is high, and thereby the transfer gate T1 is turned off. Therefore, the data stored in the latch circuits L1 and L2 is not supplied to the bit line BL. Moreover, the BZEN2 signal goes low, and hence the MIS transistor N4 is turned off. As a result, the bit line BL is brought into a floating state, and thus the write is not performed.

Figure 9:
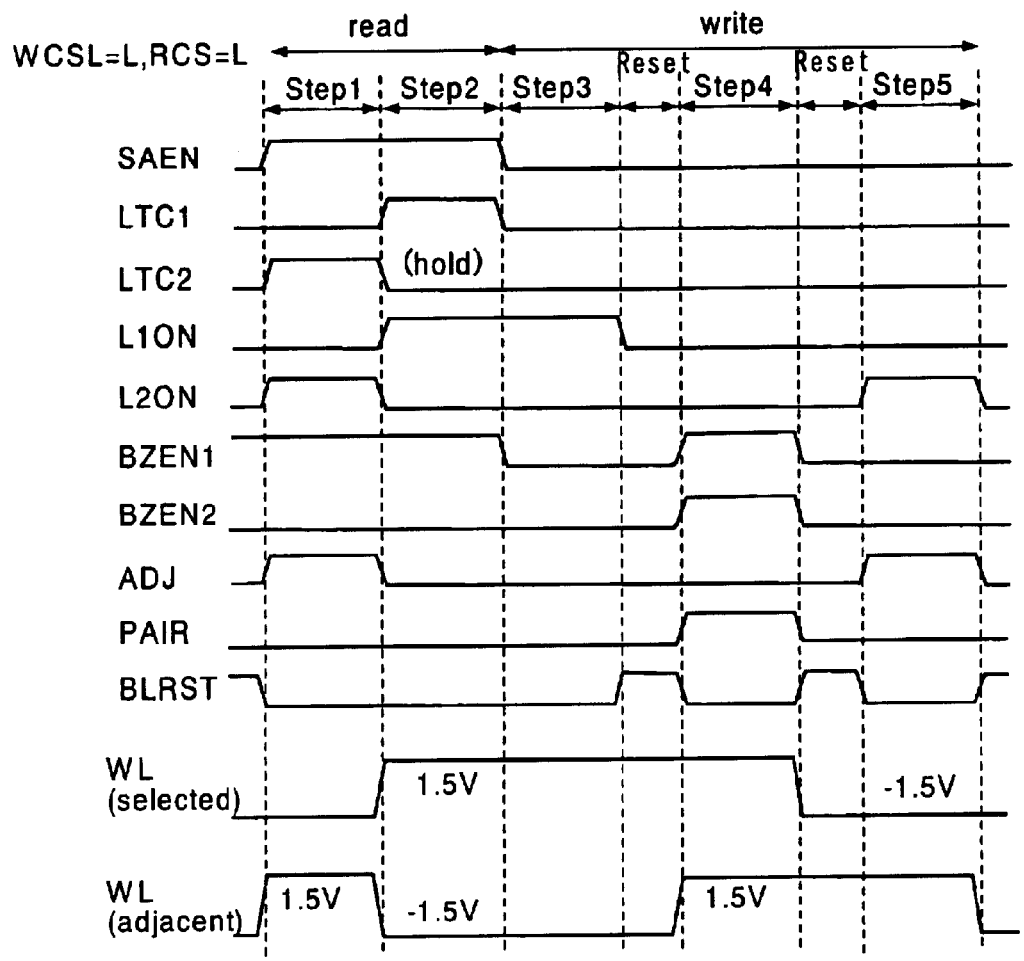
FIG. 9 is a diagram showing operational waveforms in a refresh sequence in the semiconductor memory device according to the first embodiment.

FIG. 9 is a diagram explaining the operational waveforms in the refresh sequence, and FIG. 10 is a diagram showing the relation between bit line voltage in Step 3, Step 4, and Step 5 and latch data in this refresh sequence in tabular form. In this embodiment, this refresh sequence is performed with two word lines WL with a bit line contact 21 therebetween as a unit. Namely, the refresh sequence is performed with each of the row decoder units 340 as a unit.

As can be seen from these drawings, the refresh sequence includes five steps of Step 1 to Step 5. In Step 1, using one of the pair of word lines, data in the second memory cell MC is read and stored in the latch circuit L2. In Step 2, using the other of the pair of word lines, data in the first memory cell MC is read and stored in the latch circuit L1. In Step 3, when the "1" data is stored in at least one of the latch circuits L1 and L2, the data in the latch circuit L1 is written into the first memory cell MC. In Step 4, when the "0" data is stored in both the latch circuits L1 and L2, the "0" data is written into the first memory cell MC and the second memory cell MC. In Step 5, when the "1" data is stored in at least one of the latch circuits L1 and L2, the data in the latch circuit L2 is written into the second memory cell MC.

Namely, if the "0" data is stored in both the latch circuits L1 and L2, write back to the first memory cell MC and the second memory cell MC are performed together in Step 4, and if not, in Step 3 and Step 5, that is, in different timings, write back to the first memory cell MC and write back to the second memory cell MC are individually performed. The first memory cell MC here means the memory cell MC specified by a refresh address signal generated by the controller 160, and the second memory cell MC means the memory cell MC sharing the bit line BL with the first memory cell MC and located adjacent to the first memory cell MC.

A reset period between Step 3 and Step 4 and a reset period between Step 4 and Step 5 are provided to reset the voltage of the bit line BL to 0 V. The reset periods and the period of Step 4 may be shorter than the periods of other Steps. Hence, in the refresh sequence according to this embodiment, the overhead time becomes shorter as compared with that in the related art.

Moreover, similarly to the write sequence, the refresh sequence is also performed in parallel in the sense units 300 provided in the semiconductor memory device. Accordingly, in one refresh sequence, refresh can be performed for the plural memory cells MC. More specifically, the number of memory cells to be refreshed in a single refresh sequence is twice to that of the sense unit 300.

In a more detailed explanation, in Step 1, since the ADJ signal is high and the PAIR signal is low, the other word line (the second word line) WL out of the pair of word lines selected by the row decoder unit 340 specified by the row address signal A1, A2, . . . , An−1 of the refresh address signal is selected and goes to 1.5 V.

Furthermore, since the BZEN1 signal is high, the transfer gate T1 is turned off. Since the BZEN2 signal is low, the MIS transistor N4 is turned off. Since the L2ON signal is high, the MIS transistor N2 is turned on. Since the LTC2 signal is high, the latch circuit L2 is brought into a data capture state, and the sense amplifier 302 is activated by the SAEN signal, whereby a current read from the second memory cell MC is sensed by the sense amplifier 302 and stored as read data in the latch circuit L2.

Contrary to this, in Step 2, since the ADJ signal is low and the PAIR signal is also low, one word line (the first word line) WL out of the pair of word lines selected by the row decoder unit 340 specified by the row address signal A1, A2, . . . , An−1 is selected and goes to 1.5 V. In other words, the word line WL specified by the row address signal A1, A2, . . . , An of the refresh address signal is selected and goes to 1.5 V.

Furthermore, since the BZEN1 signal is high, the transfer gate T1 is turned off. Since the BZEN2 signal is low, the MIS transistor N4 is turned off. Since the L1ON signal is high, the MIS transistor N1 is turned on. Since the LTC1 signal is high, the latch circuit L1 is brought into a data capture state, and the sense amplifier 302 is activated by the SAEN signal, whereby a current read from the first memory cell MC is sensed by the sense amplifier 302 and stored as read data in the latch circuit L1.

In Step 3, since the BZEN1 signal goes low, the transfer gate T1 is turned on when the "1" data is stored in at least one of the latch circuit L1 and the latch circuit L2. Namely, except when the "0" data is stored in both the latch circuits L1 and L2, the BZ signal is low, the NOR circuit NR302 outputs a high-level signal, and the transfer gate T1 is turned on. Moreover, the MIS transistor N3 is turned off. In addition, since the L1ON signal is high, the data in the latch circuit L1 is supplied to the bit line BL. In other words, a voltage of −1 V is supplied to the bit line BL when the latch circuit L1 holds the "0" data, and a voltage of 1.5 V is supplied to the bit line BL when the latch circuit L1 holds the "1" data.

Since the ADJ signal is low and the PAIR signal is also low, the first word line WL selected by the row address signal A1, A2, . . . , An of the refresh address signal is 1.5 V. Hence, the data in the latch circuit L1 is written back to the first memory cell MC.

On the other hand, when the "0" data is stored in both the latch circuits L1 and L2, the BZ signal is high, whereby the transfer gate T1 is turned off. Moreover, since the BZEN2 signal is low, the MIS transistor N4 is off. Accordingly, the bit line BL is brought into a floating state, and thus the write into the first memory cell MC is not performed.

During the reset period subsequent to Step 3, the BLRST signal goes high, and thereby the MIS transistor Tr202 is turned on. Consequently, the voltages of all the bit lines BL are reset to 0 V.

In Step 4, when both the latch circuits L1 and L2 hold the "0" data, the transfer gate T1 is turned off. Namely, when both the latch circuits L1 and L2 hold the "0" data, the BZ signal is high. Hence, the MIS transistor N3 is turned on. Moreover, since the BZEN2 signal is high, the MIS transistor N4 is also turned on. On the other hand, since the BZEN1 signal is high, the transfer gate T1 is turned off. Consequently, −1 V is supplied to the bit line BL.

Furthermore, since the PAIR signal is high, both the ESEL signal and the OSEL signal are high, and thus both of the pair of word lines specified by the row address signal A1, A2, . . . , An−1 are selected and both go to 1.5 V. Thus, the "0" data is written into both the first memory cell MC and the second memory cell MC.

On the other hand, when at least one of the data stored in the latch circuit L1 and the latch circuit L2 is the "1" data, the BZ signal as the output of the NOR circuit NR300 is low. As a result, the MIS transistor N3 is turned off. Furthermore, since the BZEN1 is high, the transfer gate T1 is also turned off. Hence, the bit line BL is brought into a floating state. Accordingly, the write into the first memory cell MC and the second memory cell MC is not performed.

During the reset period subsequent to Step 4, the BLRST signal goes high, and thereby the MIS transistor Tr202 is turned on. Consequently, the voltages of all the bit lines BL are reset to 0 V.

In Step 5, the BZEN1 signal is low, and hence when the "1" data is stored in at least one of the latch circuit L1 and the latch circuit L2, the transfer gate T1 is turned on. Namely,except when the "0" data is stored in both the latch circuits L1 and L2, the BZ signal is low, the NOR circuit NR302 outputs a high-level signal, and the transfer gate T1 is turned on. Further, the MIS transistor N3 is turned off. Since the L2ON signal is high, the data in the latch circuit L2 is supplied to the bit line BL. In other words, a voltage of −1 V is supplied to the bit line BL when the latch circuit L2 holds the "0" data, and a voltage of 1.5 V is supplied to the bit line BL when the latch circuit L2 holds the "1" data.

Since the ADJ signal is high and the PAIR signal is low, the second word line WL paired with the first word line WL selected by the row address signal A1, A2, . . . , An of the refresh address signal is 1.5 V. Consequently, the data in the lath circuit L2 is written back to the second memory cell MC.

On the other hand, when the "0" data is stored in both the latch circuits L1 and L2, the BZ signal is high, and thereby the transfer gate T1 is turned off. Moreover, since the BZEN2 signal is low, the MIS transistor N4 is off. Hence, the bit line BL is brought into a floating state, and the write into the second memory cell MC is not performed.

Note that, in this embodiment, in the refresh sequence, the step (Step 4) of writing the "0" data into both the first memory cell MC and the second memory cell MC is provided between the step (Step 3) of performing the write back to the first memory cell MC and the step (Step 5) of performing the write back to the second memory cell MC, but the procedure is not necessarily limited to this order. Namely, if it is allowed to increase the number of word line driving, which has to do with power consumption and delay, the step of writing the "0" data into both the first memory cell MC and the second memory cell MC may be performed before or after the step of performing the write back to the first memory cell MC and the step of performing the write back to the second memory cell MC.

As stated above, according to the semiconductor memory device according to this embodiment, the destruction of data in the memory cell MC due to "0" disturb can be avoided. Namely, if the adjacent cell sharing the bit line contact 21 with the selected cell holds the "0" data when the "0" data is written into the selected cell as shown in FIG. 44, the "0" data is to be written into both the selected cell and the adjacent cell. Thus, the occurrence of the "0" disturb can be prevented.

Similarly, also in the refresh sequence, when both the first memory cell MC corresponding to the selected cell and the second memory cell MC corresponding to the adjacent cell hold the "0" data, the "0" data is written back simultaneously to these first memory cell MC and second memory cell MC. Thus, the occurrence of the "0" disturb can be prevented also in the refresh sequence. For example, the possibility that the "0" data in the first memory cell MC which has performed write back earlier is changed to the "1" data because of the write of the "0" data into the second memory cell MC which performs write back later can be avoided.

(Second Embodiment)

In the aforementioned first embodiment, the step (Step 2 in FIG. 7) of writing the "0" data into both the selected cell and the adjacent cell and the step (Step 3 in FIG. 7) of writing the data into only the selected cell are performed in different timings, but in this embodiment, these two steps are performed simultaneously. It should be noted that in this embodiment, likewise with the aforementioned first embodiment, the influence of "1" disturb is regarded as small or regarded as being able to be avoided in some way.

Figure 11:
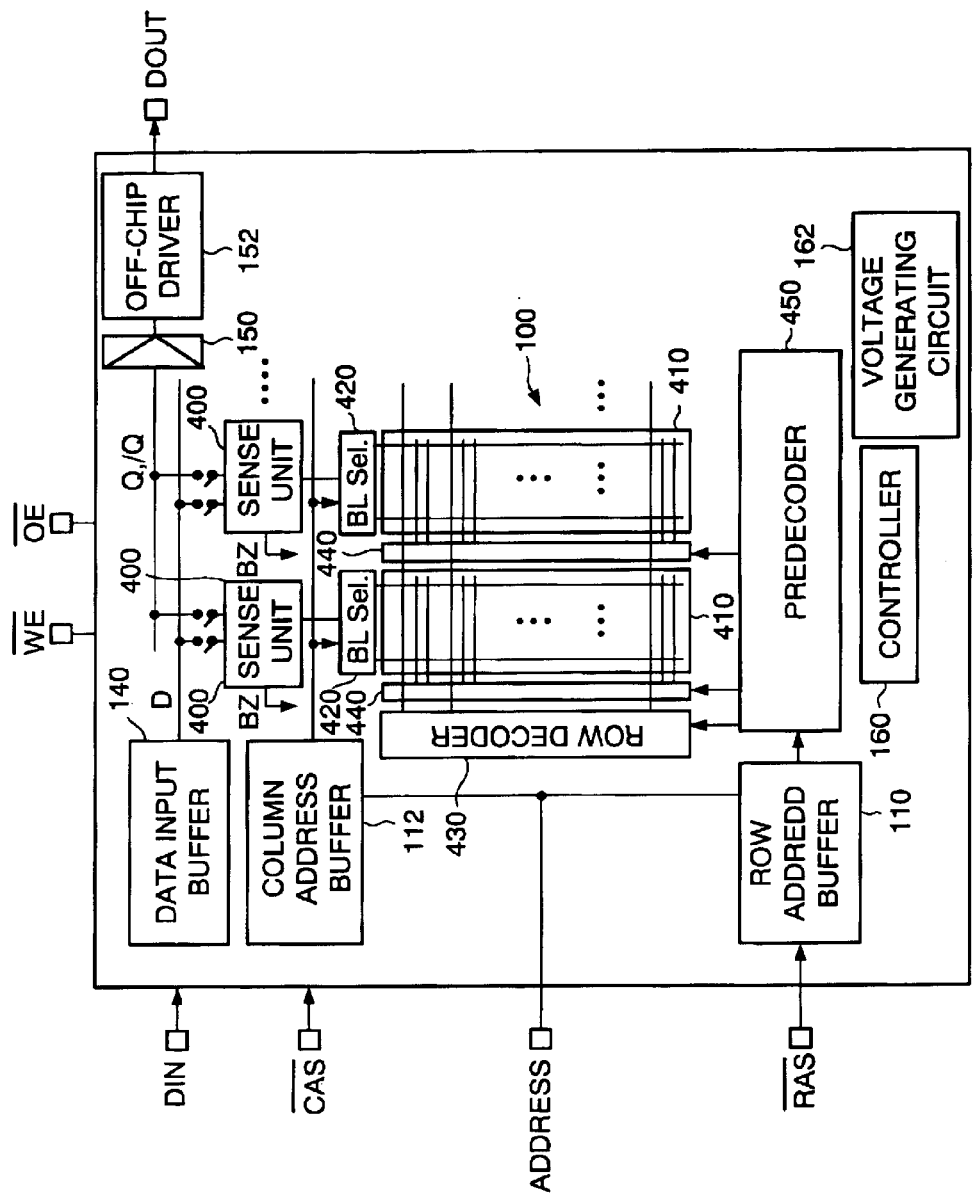
FIG. 11 is a diagram showing a chip layout of a semiconductor memory device according to a second embodiment.
Figure 12:
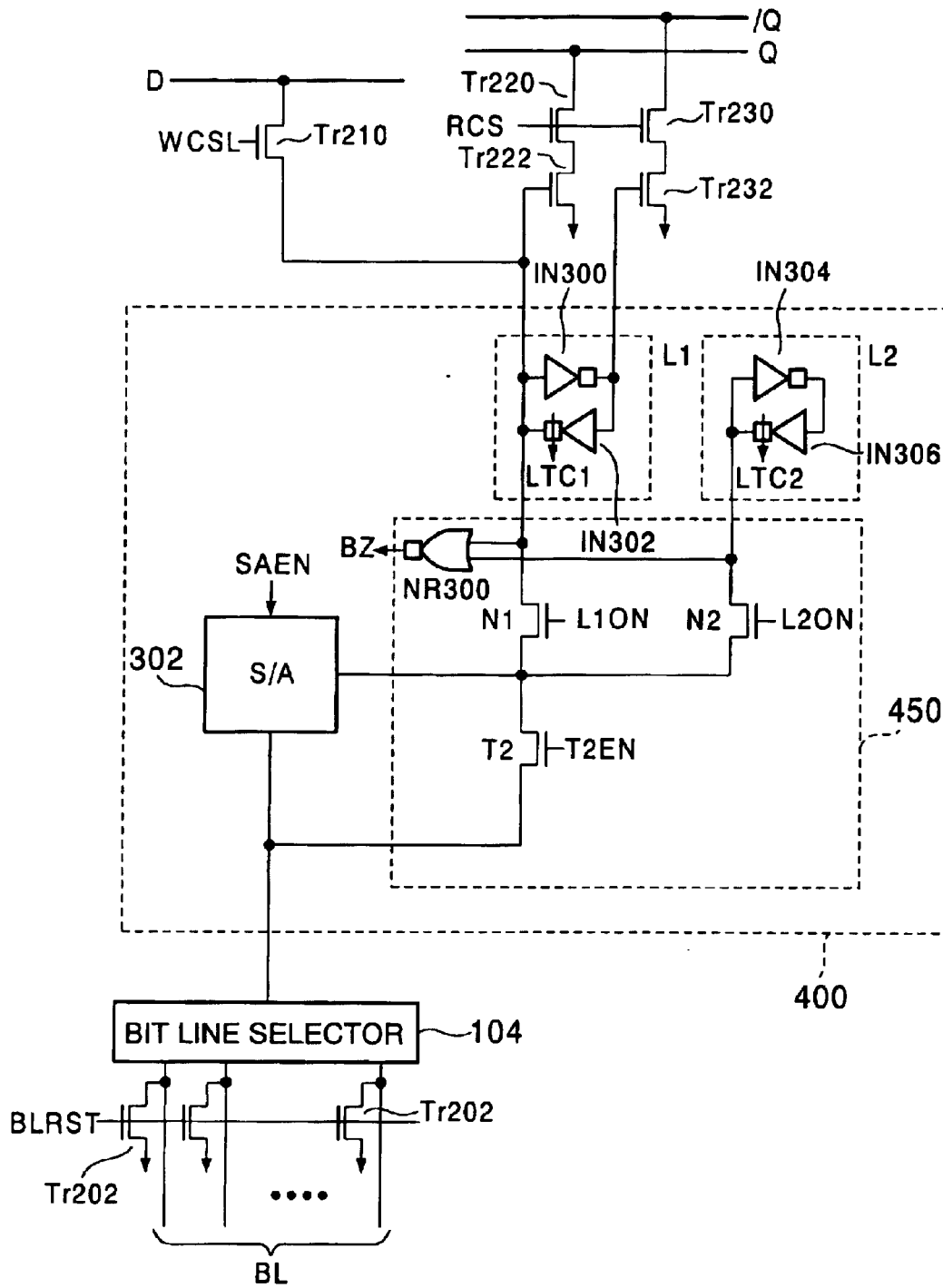
FIG. 12 is a diagram showing a circuit configuration of a sense unit according to the second embodiment and its peripheral circuit configurations.

FIG. 11 is a block diagram showing a chip layout of a semiconductor memory device according to this embodiment, and FIG. 12 is a diagram showing a circuit configuration of a sense unit 400 in FIG. 11 and its peripheral circuit configurations.

Only different portions from those in a chip layout shown in FIG. 39 will be explained. In the semiconductor memory device according to this embodiment, as shown in FIG. 11, a memory cell array 100 is divided into plural cell array blocks 410. With respect to each of the cell array blocks 410, one bit line selector 420 and one sense unit 400 are provided. The bit lines BL extending in a column direction are connected to the bit line selector 420.

In the memory cell array 100 in this embodiment, the word lines extending in a row direction include two stages of main word lines MWL and sub-word lines SWL. Namely, the main word lines MWL are provided along the row direction across the plural cell array blocks 410. These respective main word lines MWL are connected to a row decoder 430 provided on the left side of the memory cell array 100 and connected to sub-decoders 440 each provided with respect to each of the cell array blocks 410. To each of the sub-decoders 440, the sub-word lines SWL extending in the row direction in each of the cell array blocks 410 are connected, and gate electrodes 24 of the respective memory cells MC are connected to the sub-word lines SWL. Moreover, in this embodiment, in each of the cell array blocks 410, a pair of sub-word lines SWL and SWL are provided for each main word line MWL.

The sub-decoders 440 are connected to a predecoder 450 provided on the lower side of the memory cell array 100. Accordingly, each of the sub-decoders 440 selects and drives the sub-word line SWL based on a signal from the predecoder 450 and a signal from the main word line MWL.

As shown in FIG. 12, the sense unit 400 includes the sense amplifier 302, the latch circuits L1 and L2, and a control circuit 450. In the sense unit 400 according to this embodiment, the configuration of the control circuit 450 differs from that in the aforementioned first embodiment.

More specifically, the control circuit 450 includes the NOR circuit NR300 and N-type MIS transistors N1, N2, and T2. The L1ON signal is inputted to the gate terminal of the MIS transistor N1, the L2ON signal is inputted to the gate terminal of the MIS transistor N2, and a T2EN signal is inputted to a gate terminal of the MIS transistor T2. These L1ON signal, L2ON signal, and T2EN signal and control signals other than these ones are generated by the controller 160 (See FIG. 11) as stated above. The BZ signl which is the output of the NOR circuit NR300 to which the outputs of the latch circuits L1 and L2 are inputted is inputted to the predecoder 450 as will be explained later.

Figure 13:
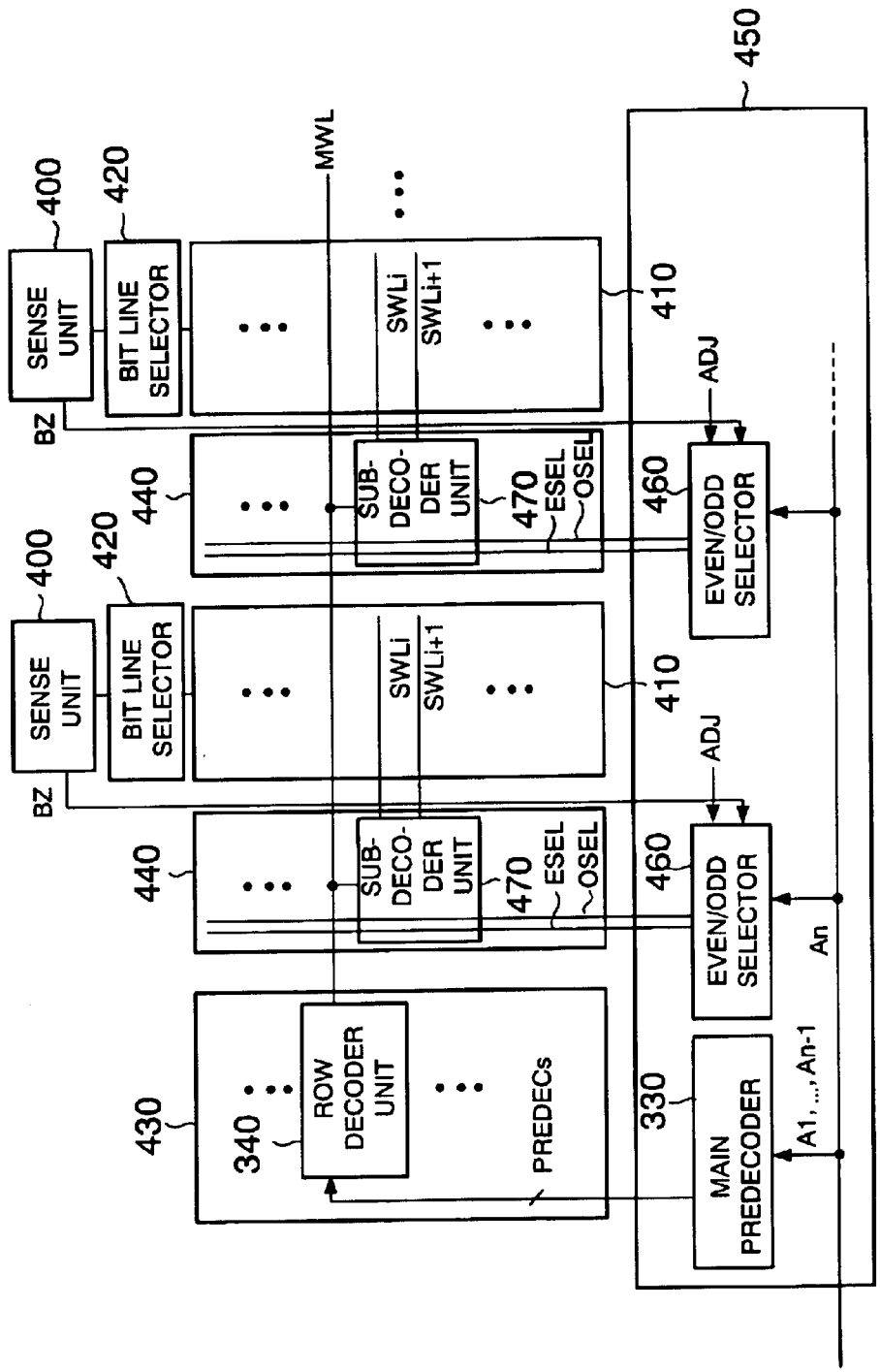
FIG. 13 is a block diagram explaining configurations of a predecoder, a row decoder, and a sub-decoder according to the second embodiment.
Figure 14:
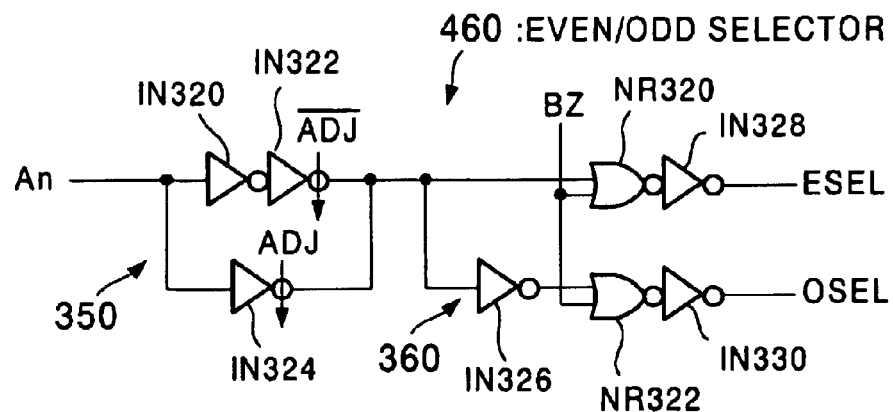
FIG. 14 is a logic circuit diagram explaining a configuration of an even/odd selector according to the second embodiment.
Figure 15:
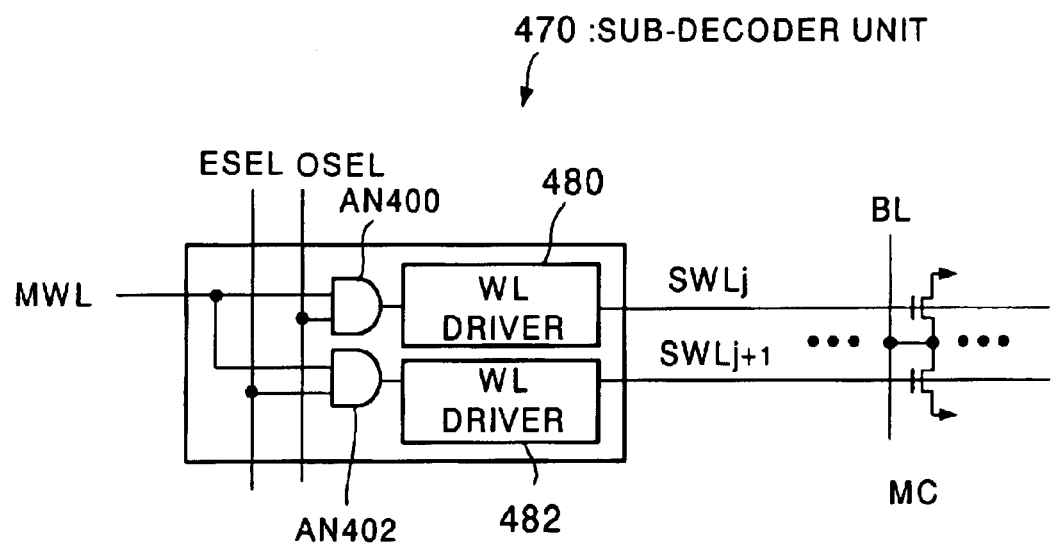
FIG. 15 is a block diagram explaining a configuration of a sub-decoder unit according to the second embodiment.

FIG. 13 is a block diagram explaining configurations of the predecoder 450, the row decoder 430, and the sub-decoder 440, FIG. 14 is a circuit diagram explaining a configuration of an even/odd selector 460, and FIG. 15 is a block diagram explaining a configuration of a sub-decoder unit 470.

As shown in FIG. 13, the predecoder 450 according to this embodiment includes one main decoder 330 and the even/odd selectors 460 each provided for each of the sub-decoders 440. As in the first embodiment, A1, A2, . . . , An−1 other than the bit An of the row address signal are inputted to the main decoder 330, and based on this row address signal, the PREDECs signal is outputted therefrom.

This PREDECs signal is inputted to each of the row decoder units 340 in the row decoder 430. The row decoder units 340 are each provided for each of the main word lines MWL, and its configuration is the same as that in FIG. 5 in the aforementioned first embodiment. Namely, one main word line MWL is selected based on the PREDECs signal.

The BZ signal and the ADJ signal are inputted to the even/odd selector 460. As shown in FIG. 14, the even/odd selector 460 according to this embodiment has the same configuration as the even/odd selector 332 of the aforementioned first embodiment except that in place of the PAIR signal, the BZ signal is inputted to the NOR circuits NR320 and NR322. The ESEL signal and the OSEL signal which are outputs from the even/odd selector 460 are inputted to each of the sub-decoder units 470 in the sub-decoder 440.

As shown in FIG. 15, the sub-decoder unit 470 includes AND circuits AN400 and AN402, and word line drivers 480 and 482. The OSEL signal and a signal from the main word line MWL are inputted to the AND circuit AN400, and the ESEL signal and the signal from the main word line MWL are inputted to the AND circuit AN402. An output of the AND circuit AN400 is inputted to the word line driver 480, and this word line driver 480 drives an even-numbered sub-word line SWLj. On the other hand, an output of the AND circuit AN402 is inputted to the word line driver 482, and this word line driver 482 drives an odd-numbered sub-word line SWLj+1.

Namely, when the main word line MWL is high and the OSEL signal is high, the even-numbered SWLj becomes high. When the main word line MWL is high and the ESEL signal is high, the odd-numbered SWLj+1 becomes high. When the main word line MWL is high and both the OSEL signal and the ESEL signal are high, both the sub-word lines SWLj and SWLj+1 become high.

Next, operational waveforms in a write sequence and operational waveforms in a refresh sequence will be explained. Note that, operational waveforms in a read sequence is the same as those in the aforementioned first embodiment, and hence the detailed explanation thereof is omitted.

Figure 16:
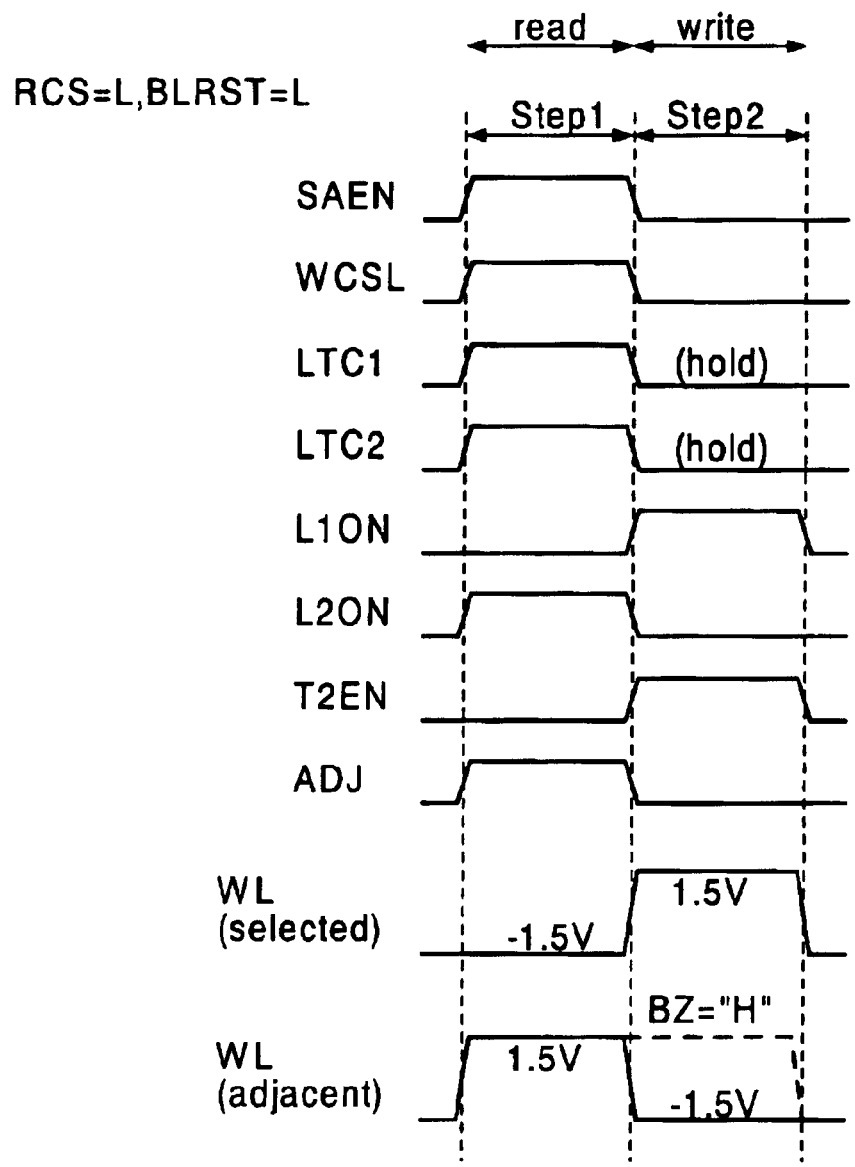
FIG. 16 is a diagram showing operational waveforms in a write sequence in the semiconductor memory device according to the second embodiment.

FIG. 16 is a diagram explaining the operational waveforms in the write sequence, and FIG. 17 is a diagram showing the relation among latch data, the BZ signal, and bit line voltage in Step 2 in this write sequence in tabular form.

As can be seen from these drawings, the write sequence includes two steps of Step 1 and Step 2. In Step 1, as in the aforementioned first embodiment, data in the adjacent cell is read and stored in the latch circuit L2, and program data is stored in the latch circuit L1. In Step 2, when both the data in the latch circuits L1 and L2 are "0", both the sub-word lines SWL of the selected cell and the adjacent cell are selected, and the "0" data is written into both the selected cell and the adjacent cell. In cases other than this one, the sub-word line SWL of the selected cell is selected, and the data in the latch circuit L1 is written into the selected cell.

The write sequence is performed in parallel in the sense units 400 provided in the semiconductor memory device. Accordingly, in one write sequence, data can be written into the plural memory cells MC (the number of which is the same as that of the sense units 400).

Since the operational waveforms in Step 1 is the same as those in the aforementioned first embodiment, Step 2 will be explained in detail. In step 2, since the L1ON signal is high, the MIS transistor N1 is turned on, and since the T2EN signal is high, the MIS transistor T2 is turned on. Consequently, the data in the latch circuit L1 is supplied to the bit line BL. More specifically, –1 V is supplied to the bit line BL when the latch circuit L1 latches the "0" data, and 1.5 V is supplied to the bit line BL when the latch circuit L1 latches the "1" data.

When the latch circuit L1 latches the "0" data and the latch circuit L2 latches "0" data, the BZ signal is high. Accordingly, both the ESEL signal and the OSEL signal from the even/odd selector 460 are high, and the selected word line WL to which the selected cell is connected and the adjacent word line WL to which the adjacent cell is connected go to 1.5 V. Consequently, the "0" data latched by the latch circuit L1 is written into both the selected cell and the adjacent cell.

On the other hand, when at least one of the latch circuit L1 and the latch circuit L2 holds the "1" data, the BZ signal is low. The ADJ signal is also low. Hence, based on the value of An of the row address signal, the ESEL signal or the OSEL signal goes high, and the selected word line WL to which the selected cell is connected goes to 1.5 V. On the other hand, the adjacent word line WL to which the adjacent cell is connected remains low. Consequently, the data latched by the latch circuit L1 is written into only the selected cell.

Figure 18:
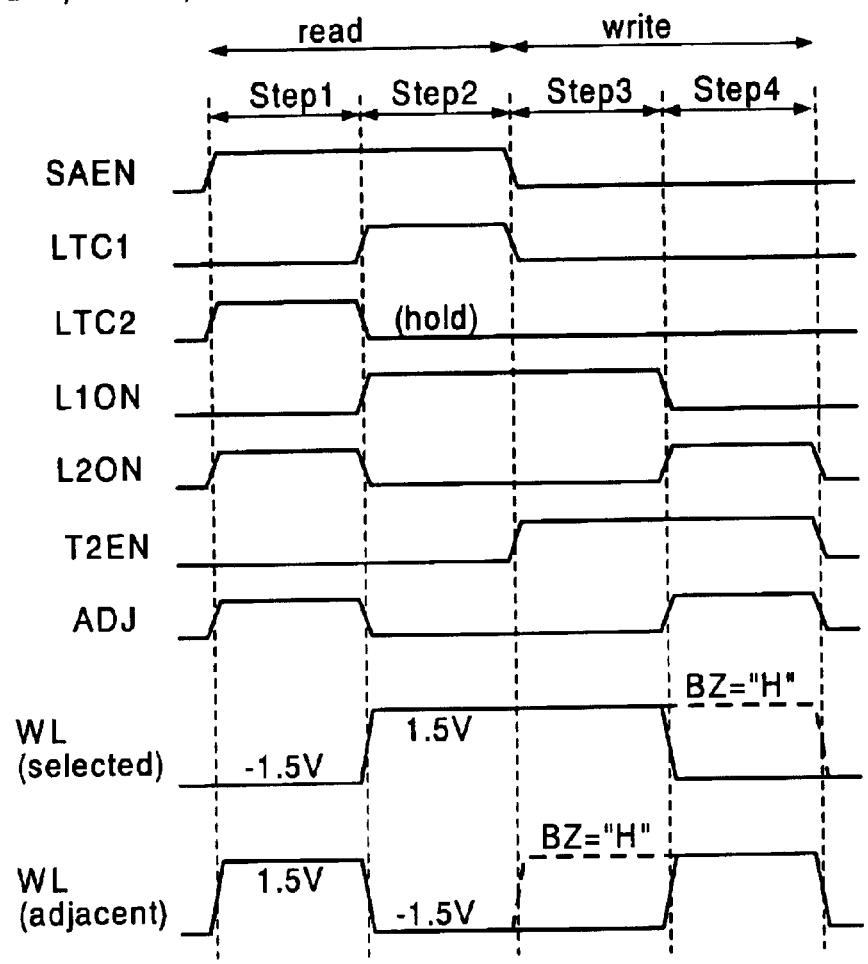
FIG. 18 is a diagram showing operational waveforms in a refresh sequence in the semiconductor memory device according to the second embodiment.

FIG. 18 is a diagram explaining the operational waveforms in the refresh sequence, and FIG. 19 is a diagram showing the relation among latch data, the BZ signal, and bit line voltage in Step 3 and Step 4 in this refresh sequence in tabular form. In this embodiment, this refresh sequence is performed with two word lines WL with the bit line contact 21 therebetween as a unit. Namely, the refresh sequence is performed with each of the row decoder units 340 as a unit.

As can be seen from these drawings, the refresh sequence includes four steps of Step 1 to Step 4. In Step 1, by driving the second word line WL which is one word line WL of the pair of word lines, data in the second memory cell MC is read and stored in the latch circuit L2. In Step 2, by driving the first word line WL which is the other word line WL of the pair of word lines, data in the first memory cell MC is read and stored in the latch circuit L1. In Step 3, when the "0" data is stored in both the latch circuits L1 and L2, the "0" data is written into both the first memory cell MC and the second memory cell MC, and when the "1" data is stored in at least one of the latch circuit L1 and L2, the data in the latch circuit L1 is written into the first memory cell MC. In Step 4, when the "0" data is stored in both the latch circuits L1 and L2, the "0" data is written again into both the first memory cell MC and the second memory cell MC, and when the "1" data is stored in at least one of the latch circuits L1 and L2, the data in the latch circuit L2 is written into the second memory cell MC.

Namely, when the "1" data is stored in at least one of the latch circuits L1 and L2, write back to the first memory cell MC is performed in step S3 and write back to the second memory cell MC is performed in Step 4. On the other hand, when the "0" data is stored in both the latch circuits L1 and L2, the "0" data is written back to the first memory cell MC and the second memory cell MC both in Step 3 and Step 4. The first memory cell MC here means the memory cell MC specified by the refresh address signal generated by the controller 160, and the second memory cell MC means the memory cell MC sharing the bit line BL with the first memory cell MC and located adjacent to the first memory cell MC.

Moreover, similarly to the write sequence, the refresh sequence is also performed in parallel in the sense units 400 provided in the semiconductor memory device. Accordingly, in one refresh sequence, refresh can be performed for the plural memory cells MC. More specifically, in one refresh sequence shown in FIG. 18, the memory cells MC, the number of which is twice that of the sense units 400, can be refreshed.

In a more detailed explanation, in Step 1, since the ADJ signal is high, the other word line (the second word line) WL out of the pair of word lines selected by the row decoder unit 340 specified by the row address signal A1, A2, ..., An−1 is selected and goes to 1.5 V.

Furthermore, since the L2ON signal is high, the MIS transistor N2 is turned on. Since the LTC2 signal is high, the latch circuit L2 is brought into a data capture state, and the sense amplifier 302 is activated by the SAEN signal, whereby a current read from the second memory cell MC is sensed by the sense amplifier 302 and stored as read data in the latch circuit L2.

Contrary to this, in Step 2, since the ADJ signal is low, one word line (the first word line) WL out of the pair of word lines selected by the row decoder unit 340 specified by the row address signal A1, A2, ..., An−1 is selected and goes to 1.5 V.

Furthermore, since the L1ON signal is high, the MIS transistor N1 is turned on. Since the LTC1 signal is high, the latch circuit L1 is brought into a data capture state, and the sense amplifier 302 is activated by the SAEN signal, whereby a current read from the first memory cell MC is sensed by the sense amplifier 302 and stored as read data in the latch circuit L1.

In Step 3, since the T2EN signal goes high, the MIS transistor T2 is turned on, and since the L1ON signal is also high, the MIS transistor N1 is also on. Hence, the data in the latch circuit L1 is supplied to the bit line BL. In other words, −1 V is supplied to the bit line BL when the latch circuit L1 holds the "0" data, and 1.5 V is supplied to the bit line BL when the latch circuit L1 holds the "1" data.

Since the BZ signal is low and the ADJ signal is low when the "1" data is stored in at least one of the latch circuits L1 and L2, the OSEL signal is high. Therefore, the word line (the first word line) WL selected by the row address signal A1, A2, ..., An of the refresh address signal goes to 1.5 V. Hence, the data in the latch circuit L1 is written back to the first memory cell MC.

On the other hand, when the "0" data is stored in both the latch circuits L1 and L2, the BZ signal is high, and thereby the ESEL signal and the OSEL signal are high. Accordingly, both of the pair of word lines specified by the row address signal A1, A2, ..., An−1 of the refresh address signal go to 1.5 V. Hence, the data in the latch circuit L1 (namely, the "0" data) is written into both the first memory cell MC and the second memory cell MC.

In Step 4, since the T2EN signal is high, the MIS transistor T2 is turned on, and since the L2ON signal goes high, the MIS transistor N2 is turned on. Thus, the data in the latch circuit L2 is supplied to the bit line BL.

When the "1" data is stored in at least one of the latch circuits L1 and L2, the BZ signal is low and the ADJ signal is high, and hence the ESEL signal is high. Therefore, the other word line (the second word line) WL of the row decoder unit 340 specified by the row address signal A1, A2, ..., An−1 of the refresh address signal goes to 1.5 V. Hence, the data in the latch circuit L2 is written back to the second memory cell MC.

On the other hand, when the "0" data is stored in both the latch circuits L1 and L2, the BZ signal is high, and thereby the ESEL signal and the OSEL signal are high. Accordingly, both of the pair of word lines specified by the row address signal A1, A2, ..., An−1 of the refresh address signal go to 1.5 V. Hence, the data in the latch circuit L1 (namely, the "0" data) is written again into both the first memory cell MC and the second memory cell MC. As stated above, in this embodiment, the "0" data is written into the selected cell and the adjacent cell twice, but this does not cause any problem.

As stated above, according to the semiconductor memory device according to this embodiment, as in the aforementioned first embodiment, the occurrence of the "0" disturb can be prevented, and hence the destruction of data in the memory cell MC can be avoided. Namely, if the adjacent cell sharing the bite line contact 21 with the selected cell holds the "0" data when the "0" data is written into the selected cell as shown in FIG. 44, the "0" data is to be written into both the selected cell and the adjacent cell. Thus, the change of the data in the adjacent cell from the "0" data to the "1" data due to the "0" disturb can be avoided.

Similarly, also in the refresh sequence, when both the first memory cell MC corresponding to the selected cell and the second memory cell MC corresponding to the adjacent cell hold the "0" data, the "0" data is written back simultaneously to these first memory cell MC and second memory cell MC in Step 3 and Step 4. Thus, the occurrence of the "0" disturb can be prevented also in the refresh sequence.

Moreover, according to this embodiment, it is necessary to provide the sub-decoder 440 for each of the cell array blocks 410, but the configuration of the sense unit 400 can be made simpler than that in the first embodiment. As can be seen from FIGS. 16 to 19, the write sequence and there fresh sequence in this embodiment have a smaller number of steps than the write sequence and the refresh sequence in the first embodiment, and consequently the time required for the write sequence and the time required for the refresh sequence can be shortened.

(Third Embodiment)

The third embodiment is based on the premise that the destruction of data in the adjacent cell does not occur if the number of times of occurrence of the "0" disturb is two or less. It is thought that the quantity of injection of holes from the selected cell to the adjacent cell caused by one "0" disturb is not so large, whereby it is possible to satisfy this premise. Moreover, a read sequence and a refresh sequence are performed in the same manner as in the related art. In a write sequence, a write operation is performed for a selected cell, and after that are fresh operation is performed for the adjacent cell. This avoids the destruction of the data in the adjacent cell due to the "0" disturb. Note that, also in this embodiment, the influence of "1" disturb is regarded as small or regarded as being able to be avoided in some way as in the aforementioned first embodiment.

A chip layout of a semiconductor memory device according to this embodiment has a configuration shown in FIG. 39, similarly to the related art. The configuration of a sense unit 130 is the same as that in FIG. 40. The configurations of the row decoder 320 and the predecoder 322 are the same as those in FIG. 3 in the first embodiment. The configuration of each of the row decoder units 340 provided in the row decoder 320 is the same as that in FIG. 5 in the first embodiment. However, the configuration of the even/odd selector 322 is different from that in the first embodiment and replaced by an even/odd selector 500 shown in FIG. 20.

Figure 20:
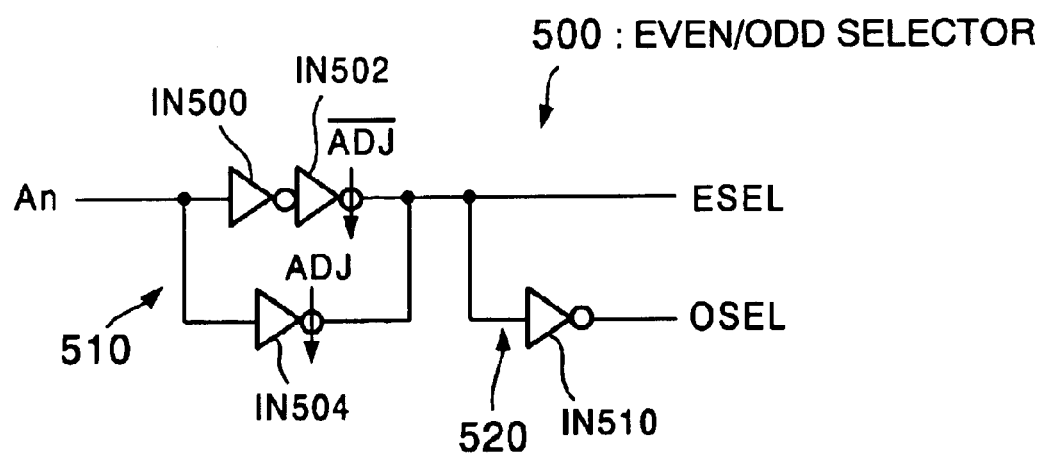
FIG. 20 is a logic circuit diagram explaining a configuration of an even/odd selector according to a third embodiment.

Namely, as shown in FIG. 20, the even/odd selector 500 according to this embodiment includes a first inversion circuit 510 and a second inversion circuit 520. The first inversion circuit 510 includes inverters IN500, IN502, and IN504. The second inversion circuit 520 includes an inverter IN510. As can be seen from FIG. 20, the configuration of the first inversion circuit 510 is the same as that of the inversion circuit 350 in the first embodiment.

The second inversion circuit 520 outputs an output of the first inversion circuit 510 as it is as the ESEL signal, and concurrently inverts the output of the first inversion circuit 510 and outputs it as the OSEL signal.

More specifically, if the ADJ signal is low, the OSEL signal goes high when the bit An of the address signal is "0", and the word line driver 360 in FIG. 5 is driven. When the signal An is "1", the ESEL signal goes high, and the word line driver 362 in FIG. 5 is driven. Namely, the word line (selected word line) WL to which the selected cell is connected is driven.

On the other hand, if the ADJ signal is high, the ESEL signal goes high when the bit An of the address signal is "0", and the word line driver 362 in FIG. 5 is driven. When the signal An is "1", the OSEL signal goes high, and the word line driver 360 in FIG. 5 is driven. Namely, by making the ADJ signal high, the word line (adjacent word line) WL to which the adjacent cell is connected can be driven. Likewise with the first embodiment and the second embodiment, the adjacent cell here means the memory cell MC sharing the bit line BL with the selected cell and located adjacent to the selected cell. In other words, it means the memory cell MC sharing the bit line contact 21 with the selected cell.

Figure 41:
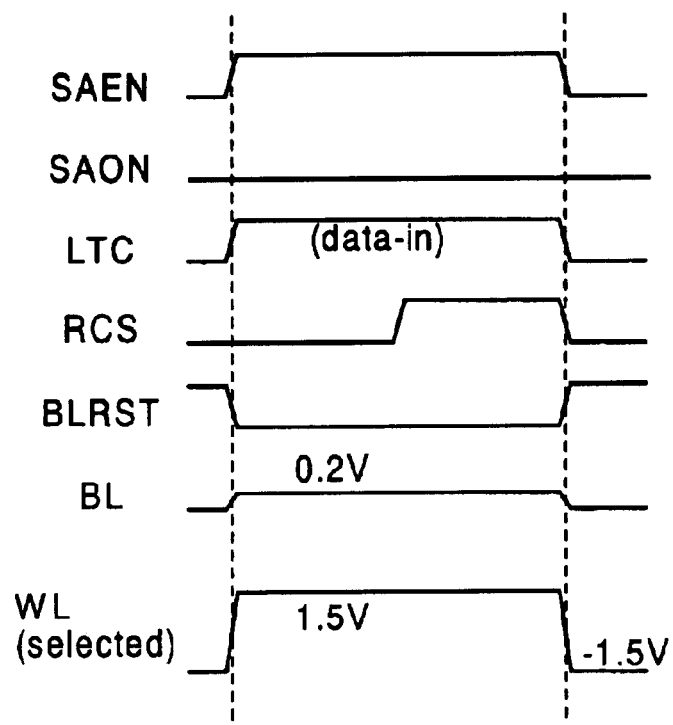
FIG. 41 is a diagram showing operational waveforms in a read sequence in the semiconductor memory device in FIG. 39.
Figure 42:
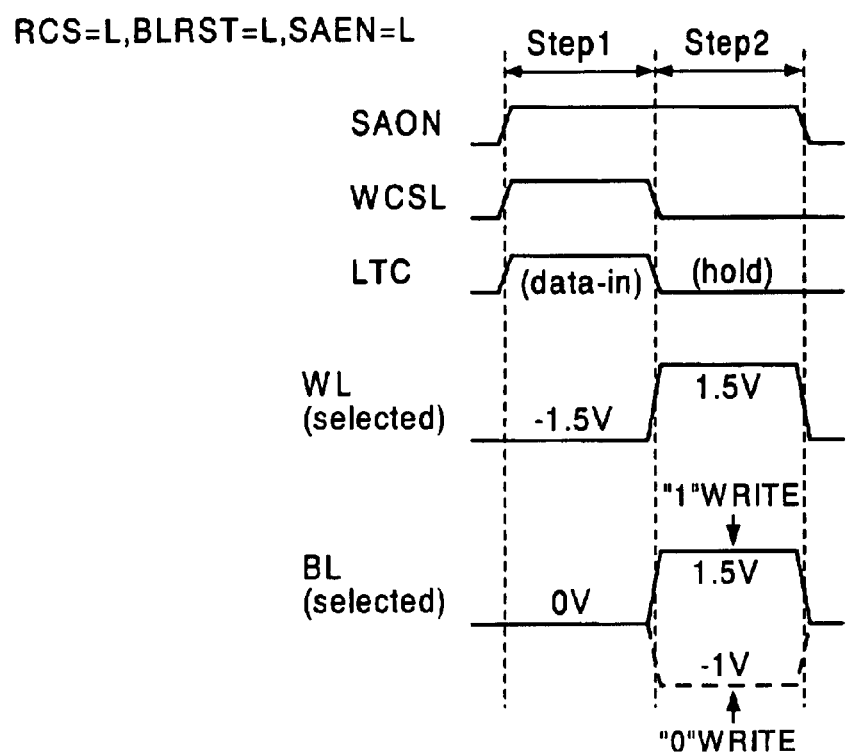
FIG. 42 is a diagram showing operational waveforms in a write sequence in the semiconductor memory device in FIG. 39.
Figure 43:
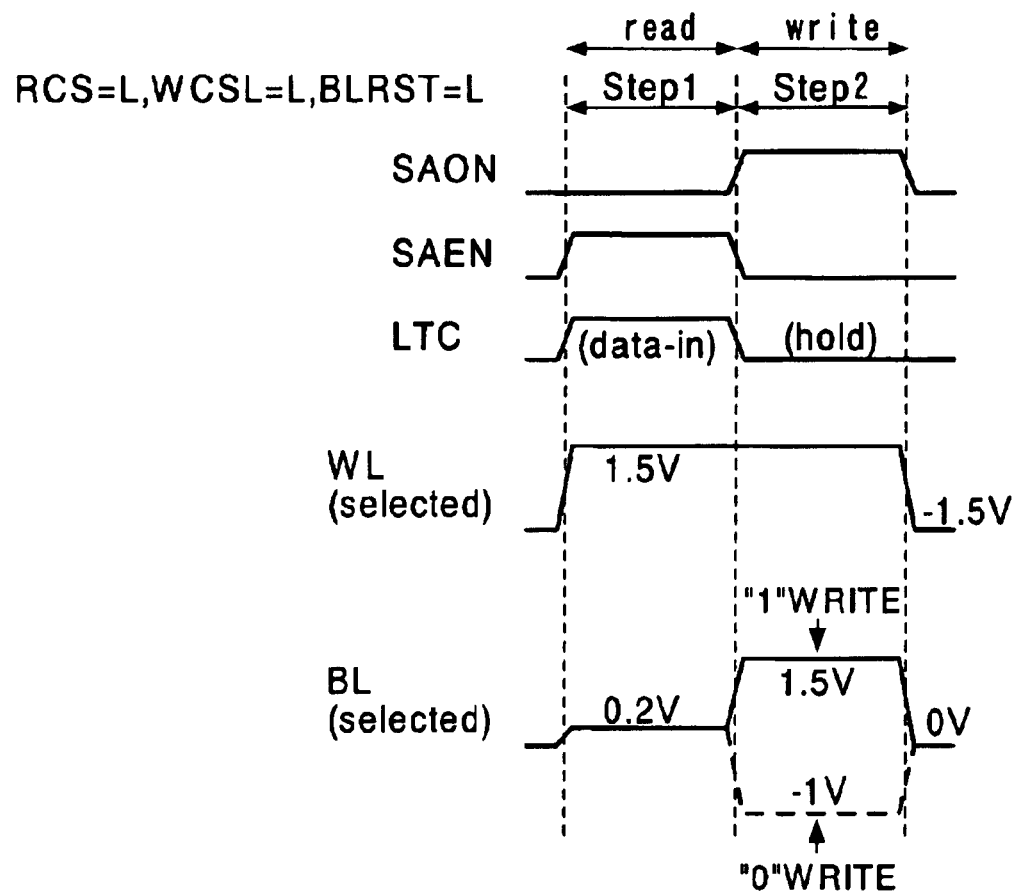
FIG. 43 is a diagram showing operational waveforms in a refresh sequence in the semiconductor memory device in FIG. 39.

As stated above, in this embodiment, the read sequence and the refresh sequence are performed in the same manner as in the related art. Namely, the read sequence is performed based on the operational waveforms shown in FIG. 41, and the refresh sequence is performed based on the operational waveforms shown in FIG. 43. In the refresh sequence, there is the possibility that the "0" disturb occurs when the "0" data is written back. However, the number of times the adjacent cell undergoes the "0" disturb in the refresh sequence is one, which does not probably cause data destruction.

Figure 21:
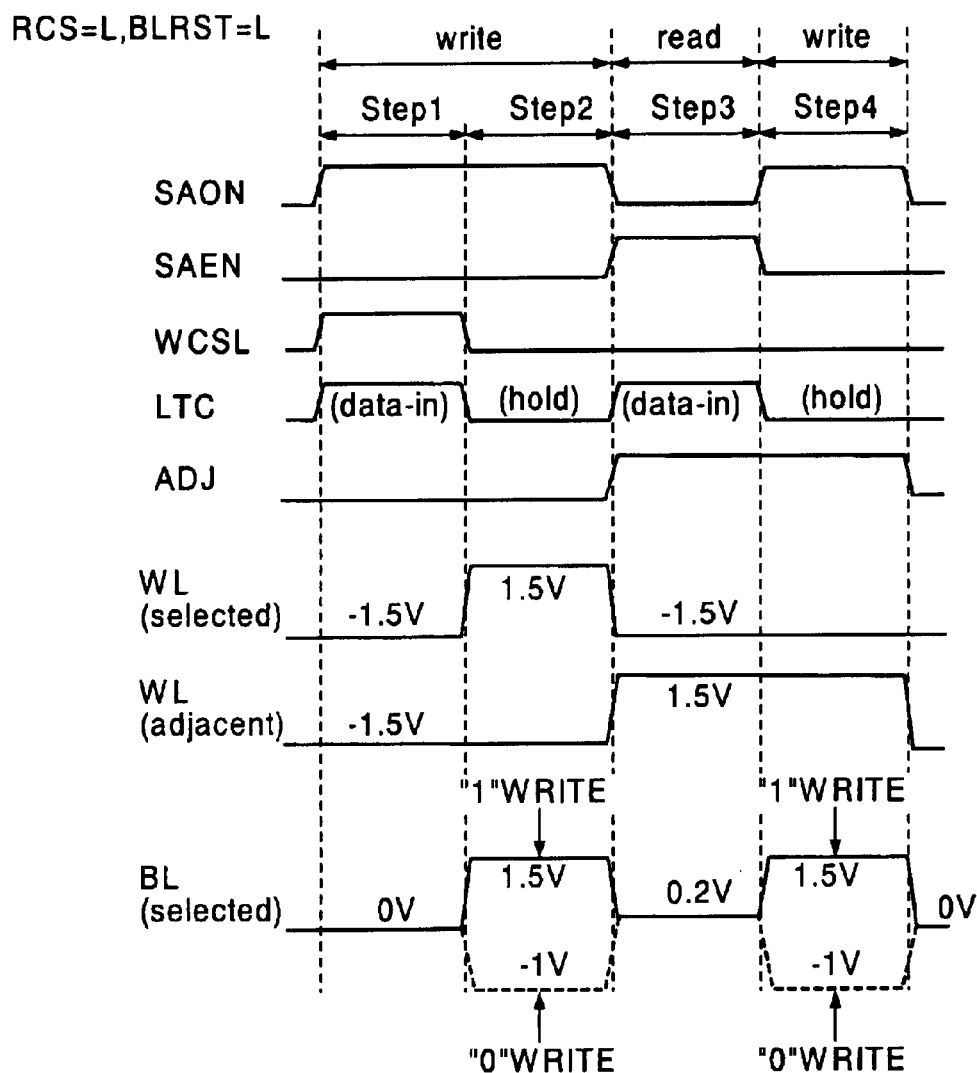
FIG. 21 is a diagram showing operational waveforms in a write sequence in a semiconductor memory device according to the third embodiment.

FIG. 21 is a diagram explaining operational waveforms in the write sequence according to this embodiment. As can be seen from FIG. 21, the write sequence includes four steps of Step 1 to Step 4. In Step 1, data to be written is stored in a latch circuit 202 in FIG. 40. In Step 2, the data stored in the latch circuit 202 is written into the selected cell. In step 3, data in the adjacent cell is stored in the latch circuit 202. In Step 4, the data stored in the latch circuit 202 is written back to the adjacent cell. As can be found from the above, in this embodiment, irrespective of the content of the data to be written and irrespective of the content of the data held in the adjacent cell, the adjacent cell is refreshed in Step 3 and Step 4.

Figure 40:
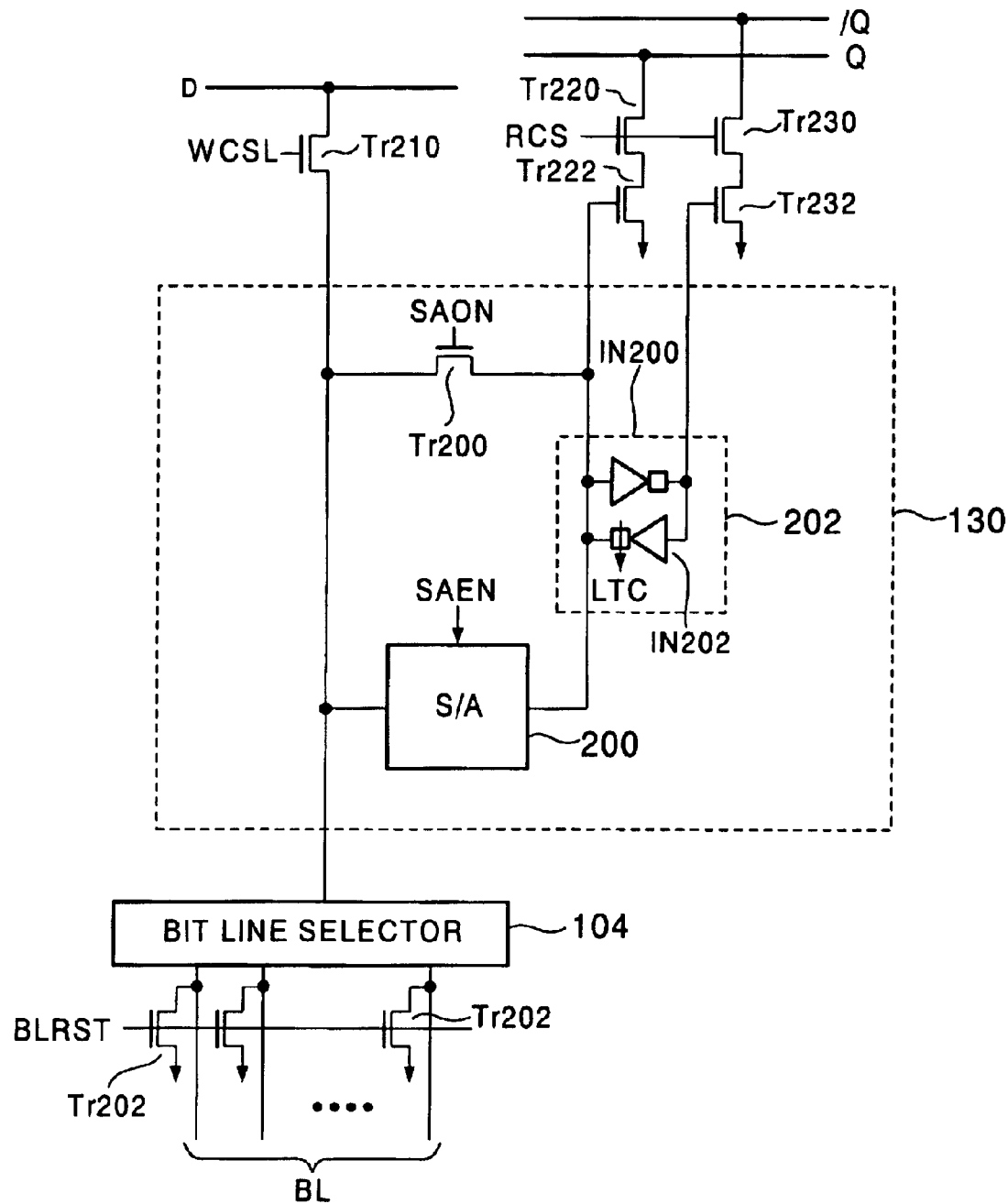
FIG. 40 is a diagram showing a circuit configuration of a sense unit in FIG. 39 and its peripheral circuit configurations.

In a more detailed explanation, in Step 1, since the WCSL signal goes high, the MIS transistor Tr210 in FIG. 40 is turned on, and since the SAON signal goes high, the MIS transistor Tr200 is turned on. Moreover, since the LTC signal goes high, the data to be written is captured into the latch circuit 202.

In Step 2, since the SAON signal is high, the data stored in the latch circuit 202 is supplied to the bit line BL. Namely, −1 V is supplied to the bit line BL when the latch circuit 202 latches the "0" data, and 1.5 V is supplied to the bit line BL when the latch circuit 202 latches the "1" data.

Further, since the ADJ signal is low, the wore line (selected word line) WL specified by the address signal A1, A2, . . . , An goes to 1.5 V. Consequently, the data stored in the latch circuit 202 is written into the selected cell.

In Step 3, since the ADJ signal is high, the word line (adjacent word line) WL which has not been selected in Step 2 is selected out of the pair of word lines connected to the row decoder unit 340 specified by the address signal A1, A2, . . . , An−1 and goes to 1.5 V. Moreover, since the SAEN signal is high, a sense amplifier 200 is activated, and a current read from the adjacent cell is sensed by the sense amplifier 200 and stored as read data in the latch circuit 202.

In Step 4, since the SAON signal goes high, the MIS transistor Tr200 is turned on, and the data stored in the latch circuit 202 is supplied to the bit line BL. Namely, −1 V is supplied to the bit line BL when the latch circuit 202 latches the "0" data, and 1.5 V is supplied to the bit line BL when the latch circuit 202 latches the "1" data. Since the ADJ signal remains high, the adjacent word line WL is maintained at 1.5 V and consequently the data in the bit line BL is written back to the adjacent cell.

As stated above, according to the semiconductor memory device according to this embodiment, the destruction of the data in the adjacent cell due to the "0" disturb can be avoided, and the configuration of the sense unit 130 can be made the same as that in the related art. Namely, the number of the latch circuit 202 of the sense unit 130 can be one.

More specifically, in this embodiment, when the adjacent cell holds the "0" data and the "0" data is written into the selected cell, the selected cell is affected by the "0" disturb in Step 4 in this write sequence. However, the number of times of "0" disturb in the write sequence is one, and hence the "0" data written into the selected cell is not probably destroyed.

The cumulative number of times of "0" disturb becomes the maximum when one "0" disturb occurs in the write sequence and in addition one "0" disturb occurs in there fresh sequence. However, even in this case, the total number of times of "0" disturb is two, which does not probably cause the destruction of the data in the memory cell MC.

Figure 22:
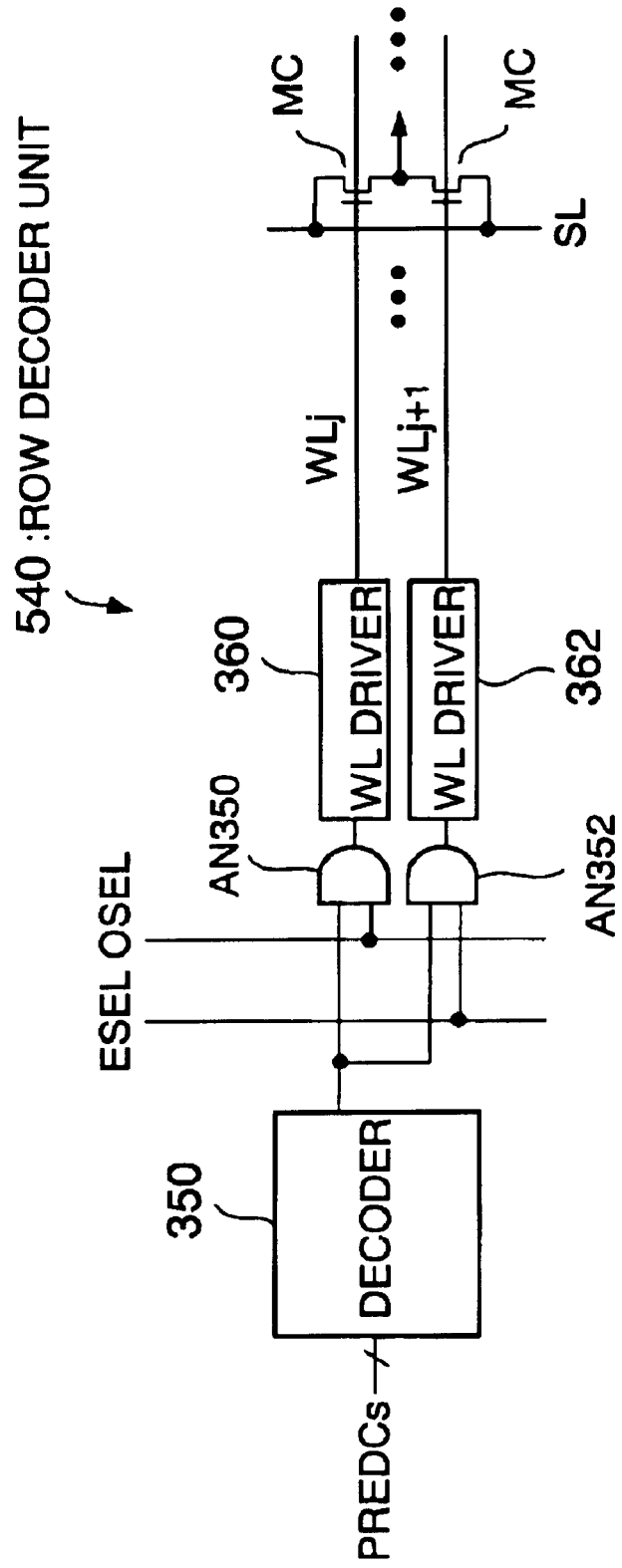
FIG. 22 is a block diagram explaining a configuration of a row decoder unit when the semiconductor memory device according to the third embodiment is modified.

The semiconductor memory device assumed in this embodiment is the one in which "0" disturb occurs but "1" disturb does not. It should be noted, however, that this embodiment is applicable to the contrary case. Namely, this embodiment can be applied also to the semiconductor device in which the "1" disturb occurs, but the "0" disturb does not occur. In this case, it is necessary to replace the row decoder unit 340 shown in FIG. 5 with a row decoder unit 540 shown in FIG. 22. Namely, it is necessary to connect the "selected cell" which is the memory cell MC into which data is to be written and the "adjacent cell" which is the memory cell sharing a source line SL with this selected cell and located adjacent to the selected cell to one row decoder unit 540.

(Fourth Embodiment)

In the aforementioned first to third embodiments, their objects are to avoid the destruction of data in the memory cell MC due to the "0" disturb, and on the other hand, an object of the fourth embodiment is to avoid the destruction of data in the memory cell MC due to the "1" disturb. The influence of "0" disturb is regarded as small or regarded as avoidable in some way.

Figure 45:
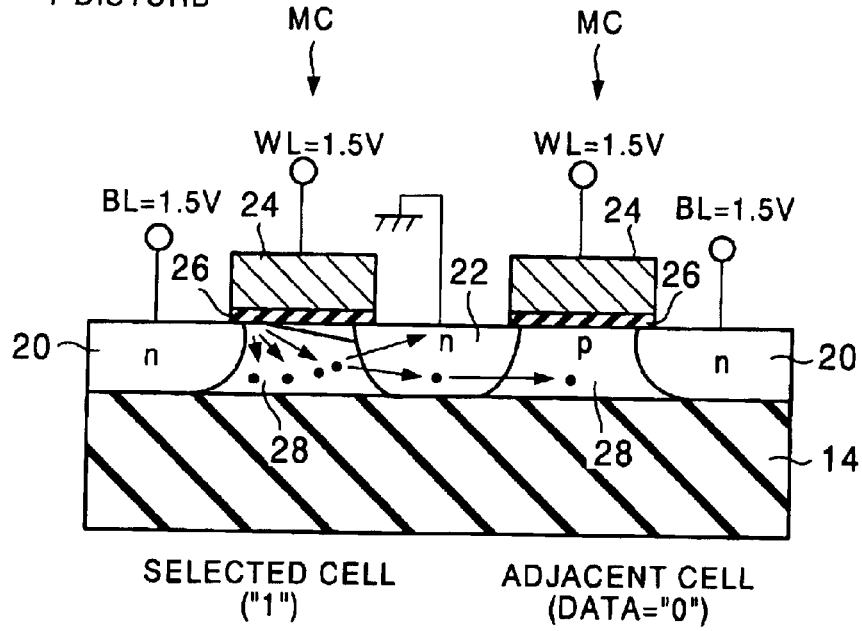
FIG. 45 is a diagram explaining the principle of "1" disturb which occurs between the "selected cell" as a memory cell whose data is to be written into and the "adjacent cell" which shares a source line with the selected cell and is located adjacent to the selected cell.

As shown in FIG. 45, the "1" disturb occurs between the "selected cell" and the "adjacent cell" which is the memory cell MC sharing the source line SL with this selected cell and located adjacent to the selected cell. Moreover, as stated before, the "1" disturb occurs when the adjacent cell holds the "0" data. Hence, in this embodiment, in a write sequence, after data in the adjacent cell is read, data is written into the selected cell. Subsequently, only when the adjacent cell holds the "0" data, the "0" data is written into the adjacent cell. By doing so, the occurrence of the "1" disturb is prevented, and the destruction of the data in the adjacent cell due to the "1" disturb can be avoided.

A chip layout of a semiconductor memory device according to this embodiment has the configuration in FIG. 39, similarly to the related art. However, in place of the sense unit 130 in FIG. 39, a sense unit 600 shown in FIG. 23 is provided.

Figure 23:
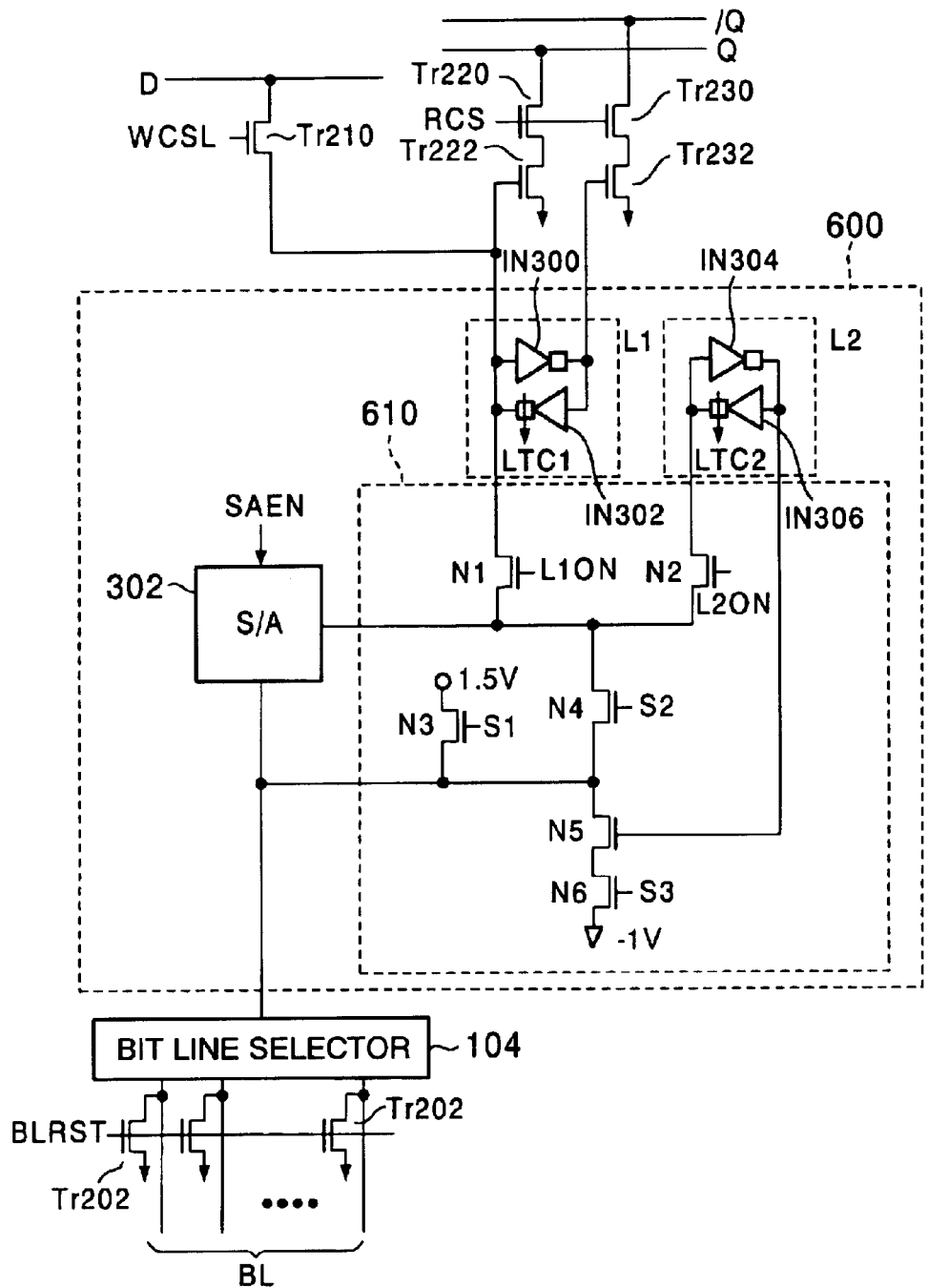
FIG. 23 is a diagram showing a circuit configuration of a sense unit according to a fourth embodiment and its peripheral circuit configurations.

As shown in FIG. 23, the sense unit 600 according to this embodiment includes two latch circuits L1 and L2, the sense amplifier 302, and the control circuit 610. As can be seen from FIG. 23, in this sense unit 600, a circuit configuration of the control circuit 610 is different from a circuit configuration in the sense unit 300 in FIG. 2 in the aforementioned first embodiment.

Namely, the control circuit 610 includes N-type MIS transistors N1 to N6. The L1ON signal is inputted to a gate electrode of the MIS transistor N1, the L2ON signal is inputted to a gate electrode of the MIS transistor N2, an S1 signal is inputted to a gate electrode of the MIS transistor N3, an S2singal is inputted to a gate electrode of the MIS transistor N4, an output signal of the inverter IN304 in the latch circuit L2 is inputted to a gate electrode of the MIS transistor N5, and an S3 signal is inputted to a gate electrode of the MIS transistor N6. As stated above, the L1ON signal, the L2ON signal, the S1 signal, the S2 signal, the S3 signal, and other control signals are generated by the controller 160 (See FIG. 39).

Figure 24:
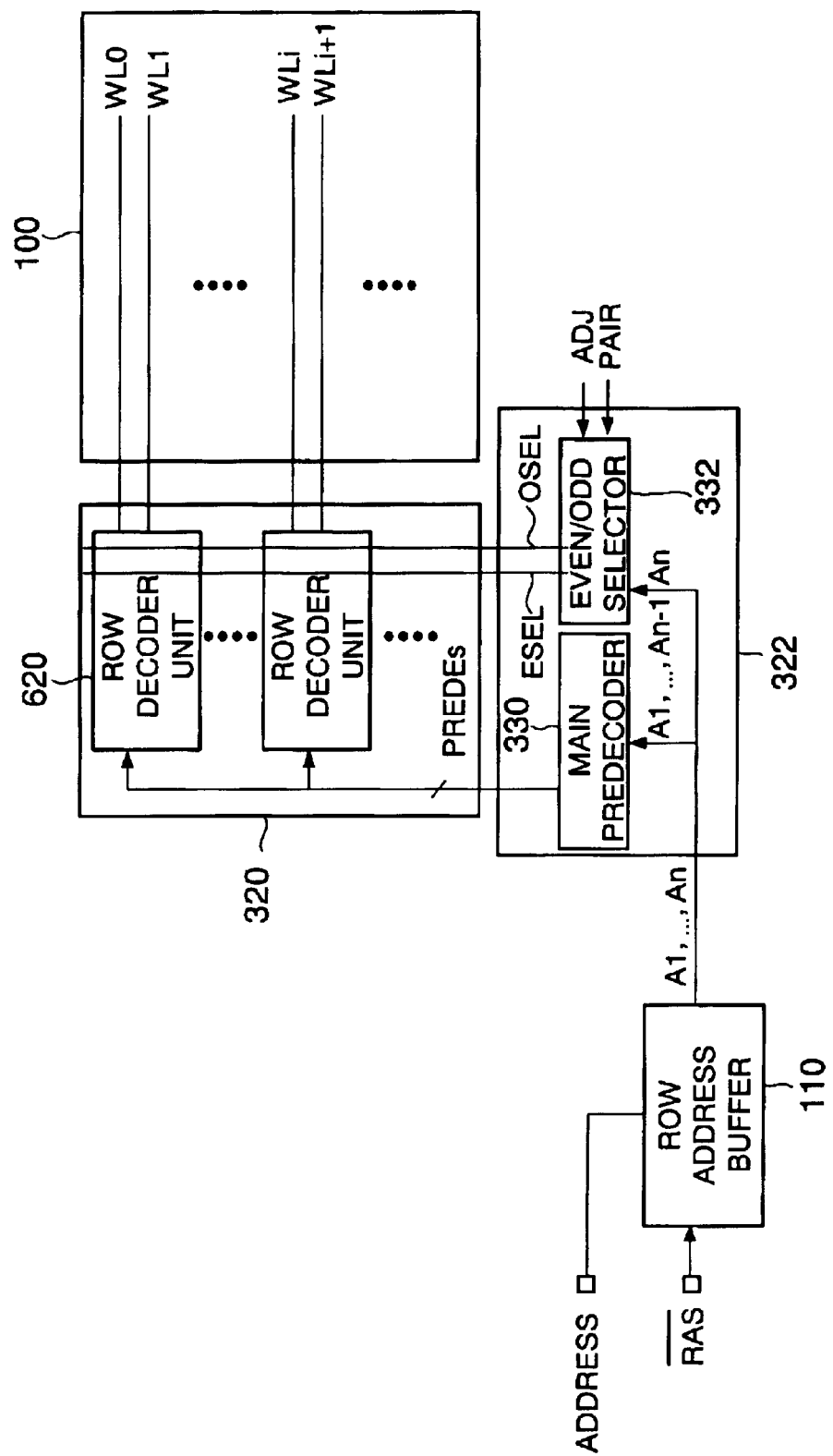
FIG. 24 is a block diagram showing configurations of a predecoder and a row decoder according to the fourth embodiment.

FIG. 24 is a block diagram showing configurations of the row decoder 320 and the predecoder 322 according to this embodiment. As shown in FIG. 24, in this embodiment, the configuration of the row decoder 320 is slightly different from that in FIG. 3 in the aforementioned first embodiment. More specifically, the row decoder 320 according to this embodiment includes a plurality of row decoder units 620. A pair of word lines are connected to each of the row decoder units 620. In this embodiment, however, gate electrodes of a pair of memory cells MC and MC which share the source line SL are connected to the pair of word lines. For example, the memory cell MC connected to a word line WL0 and the memory cell MC connected to a word line WL1 share the source line SL and are located adjacent to each other.

Figure 25:
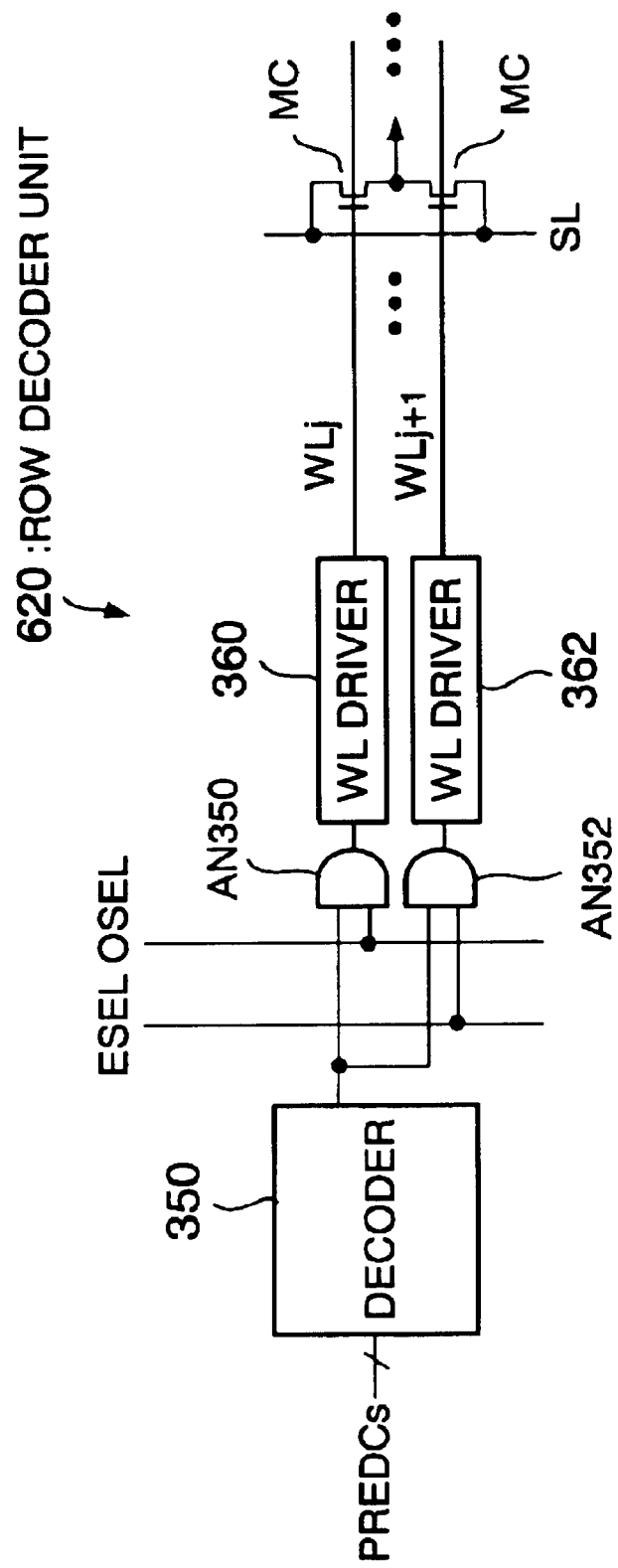
FIG. 25 is a block diagram explaining a configuration of a row decoder unit according to the fourth embodiment.

FIG. 25 is a block diagram showing a configuration of the row decoder unit 620 according to this embodiment. As shown in FIG. 25, its basic configuration is the same as that of the row decoder unit 340 in FIG. 5 in the aforementioned first embodiment, but a combination of the word lines WL connected to the word line drivers 360 and 362 is different from that in the first embodiment.

Namely, connected to the word line driver 360 is the word line WLj which is connected to a gate electrode of one memory cell MC out of the pair of memory cells MC and MC sharing the source line SL. Connected to the word line driver 362 is the word line WLJ+1 which is connected to a gate electrode of the other memory cell MC out of the pair of memory cells MC and MC sharing the source line SL. Needless to say, gate electrodes of the plural memory cells MC are connected to these word lines WLj and WLj+1.

Next, operational waveforms in a write sequence and operational waveforms in a refresh sequence in a semiconductor memory device according to this embodiment will be explained. It should be noted that since operational waveforms in a read sequence are the same as those in the related art, the detailed explanation thereof is omitted.

Figure 26:
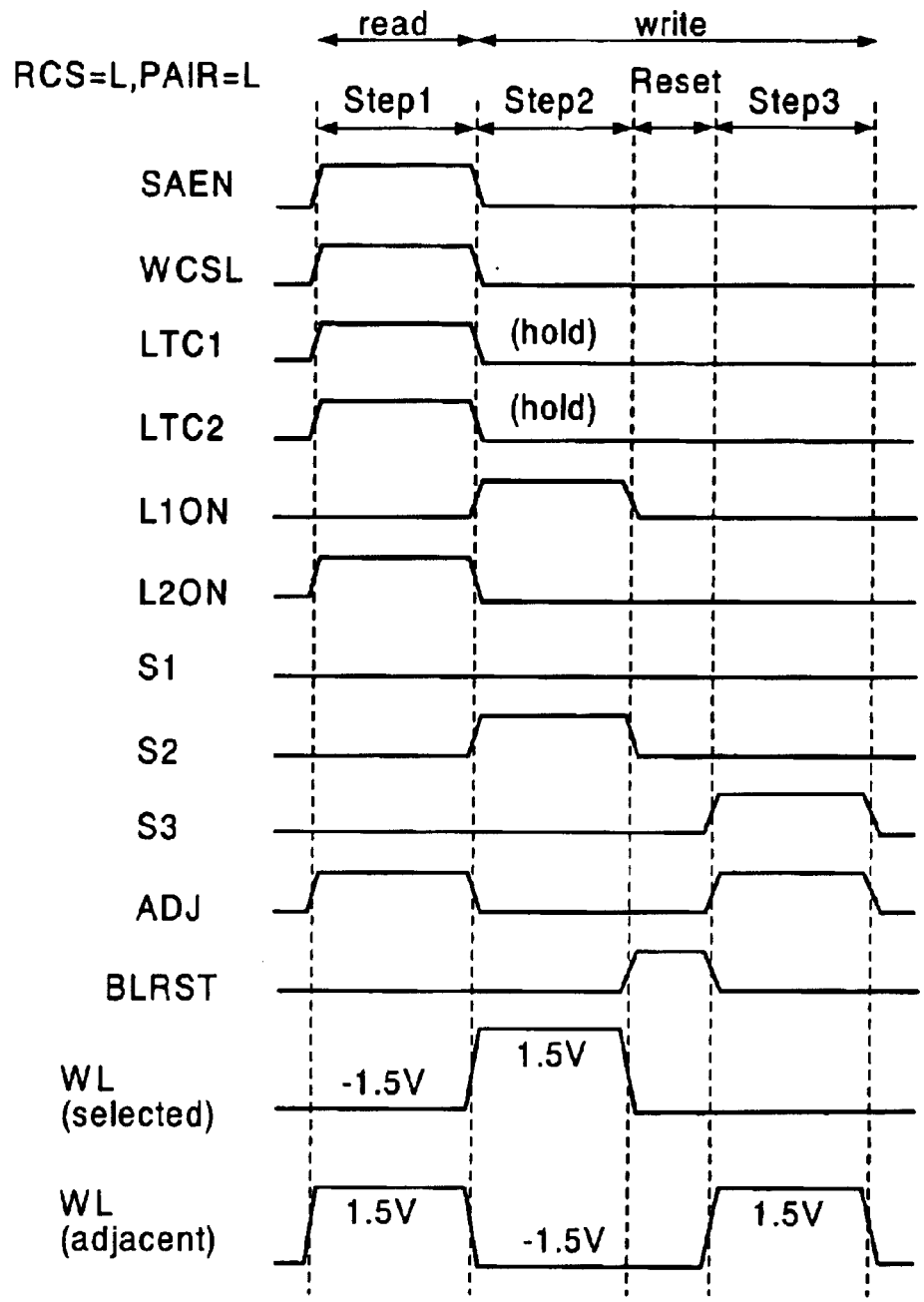
FIG. 26 is a diagram showing operational waveforms in a write sequence in a semiconductor memory device according to the fourth embodiment.

FIG. 26 is a diagram explaining the operational waveforms in the write sequence in the semiconductor memory device according to this embodiment, and FIG. 27 is a diagram showing the relation between bit line voltage in Step 2 and Step 3 and latch data in this write sequence in tabular form.

As can be seen from these drawings, the write sequence includes three steps of Step 1 to Step 3. In Step 1, data in the adjacent cell is read and stored in the latch circuit L2, and program data is stored in the latch circuit L1. In Step 2, the data in the latch circuit L1 is written into the selected cell. In Step 3, only when the data of the adjacent cell stored in the latch circuit L2 is "0" data, this "0" data is written into the adjacent cell. Moreover, there is a reset period between Step 2 and Step 3 during which all of the bit lines BL are reset to 0 V.

The write sequence is performed in parallel in the sense units 600 provided in the semiconductor memory device. Accordingly, in one write sequence, data can be written into the plural memory cells MC (the number of which is the same as that of the sense units 600).

In a more detailed explanation, in Step 1, the WCSL signal and the LTC1 signal go high, and the program data is stored in the latch circuit L1. Moreover, since the ADJ signal is high, and the PAIR signal remains low from Step 1 to Step 3, the word line (adjacent word line) WL of the adjacent cell which shares the source line SL with the selected cell connected to the word line (selected word line) WL selected by the row address signal A1, A2, . . . , An is selected and goes to 1.5 V.

Further, since the L2ON is high, the MIS transistor N2 is turned on. Since the sense amplifier 302 is activated by the SAEN signal, a current read from the adjacent cell is sensed by the sense amplifier 302, and stored as read data in the latch circuit L2.

In Step 2, the ADJ signal goes low, and the PAIR signal is low, and thereby only the word line WL specified by the row address signal A1, A2, . . . , An is selected and goes to 1.5 V. Moreover, since the L1ON signal is high, the MIS transistor N1 is turned on, and since the S2 signal is high, the MIS transistor N4 is turned on. Therefore, the data stored in the latch circuit L1 is supplied to the bit line BL. Namely, −1 V is supplied to the bit line BL when the latch circuit L1 latches the "0" data, and 1.5 V is supplied to the bit line BL when the latch circuit L1 latches the "1" data. Consequently, the data stored in the latch circuit L1 is written into the selected cell.

During the reset period subsequent to Step 2, the BLRST signal goes high. Hence, the MIS transistor Tr202 is turned on, and each of the bit lines BL is reset to 0 V.

In Step 3, since the ADJ signal goes high and the PAIR signal is low, only the word line (adjacent word line) WL connected to the adjacent cell is selected and goes to 1.5 V. Moreover, since the S3 signal goes high, the MIS transistor N6 is tuned on. When the latch circuit L2 latches the "1" data, an output signal of the inverter IN304 of the latch circuit L2 goes low, and thereby the MIS transistor N5 is turned off. Consequently, the bit line BL is brought into a floating state, whereby write into the adjacent cell is not performed.

Contrary to this, when the latch circuit L2 latches the "0" data, the output signal of the inverter IN304 of the latch circuit L2 goes high, and thereby the MIS transistor N5 is turned on. Consequently, the bit line BL goes to −1 V, and the "0" data is written into the adjacent cell.

The reason why the refresh sequence is performed only when the adjacent cell holds the "0" data as stated above is as follows. (1) When the adjacent cell holds the "1" data, it is not affected by the "1" disturb even if write into the selected cell is performed in Step 2. (2) If the "1" data is rewritten into the adjacent cell in Step 3, the adjacent cell is affected by the "1" disturb when the "0" data is written into the selected cell in Step 2. From such two reasons, only when the adjacent cell holds the "0" data, the refresh sequence for the adjacent cell is executed.

Figure 28:
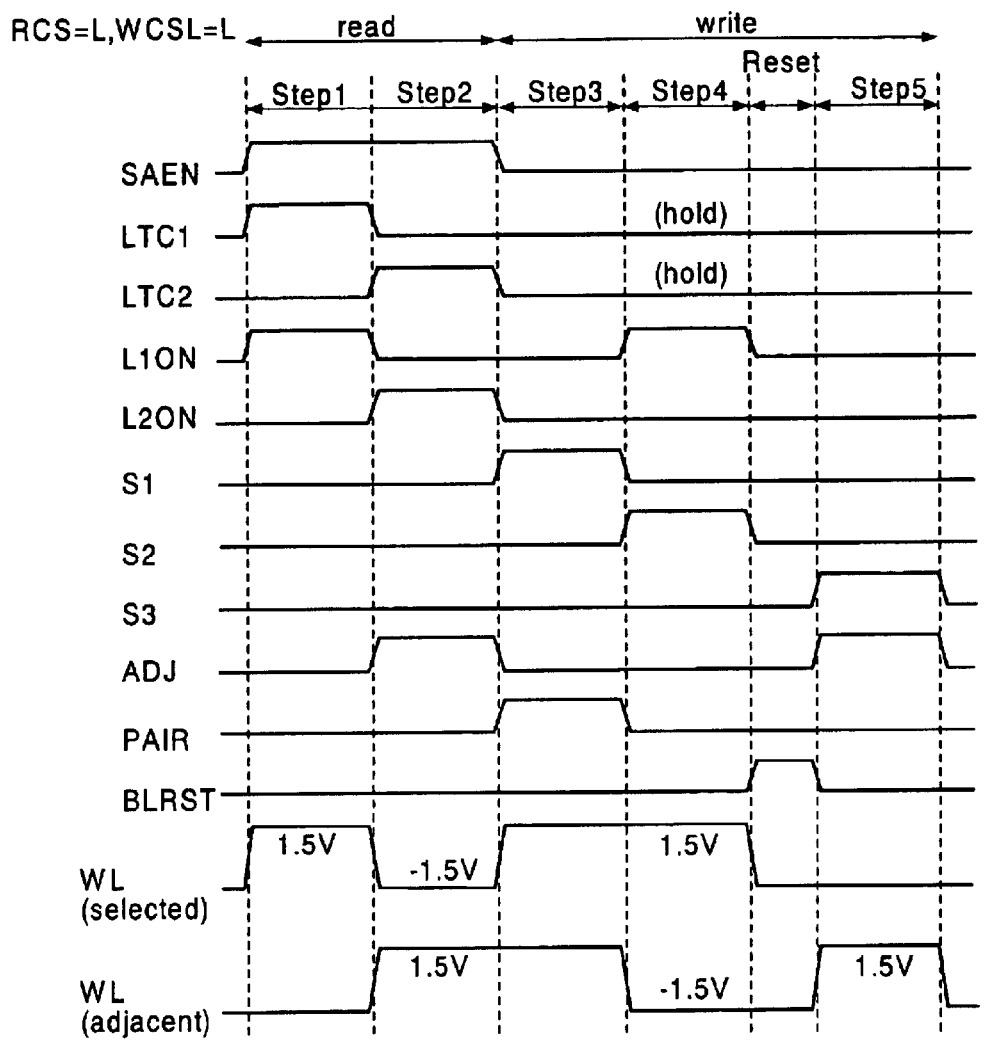
FIG. 28 is a diagram showing operational waveforms in a refresh sequence in the semiconductor memory device according to the fourth embodiment.
Figure 30:
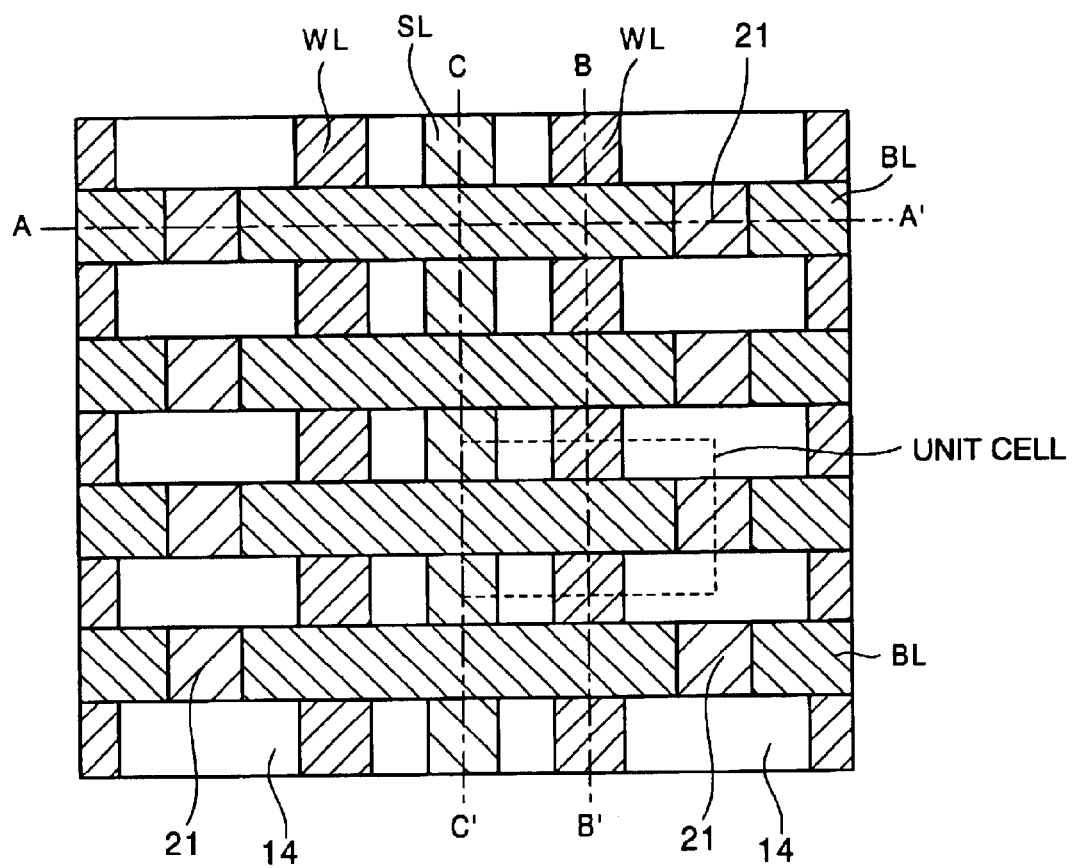
FIG. 30 is a plane view of a general FBC structured memory cell array.
Figure 31:
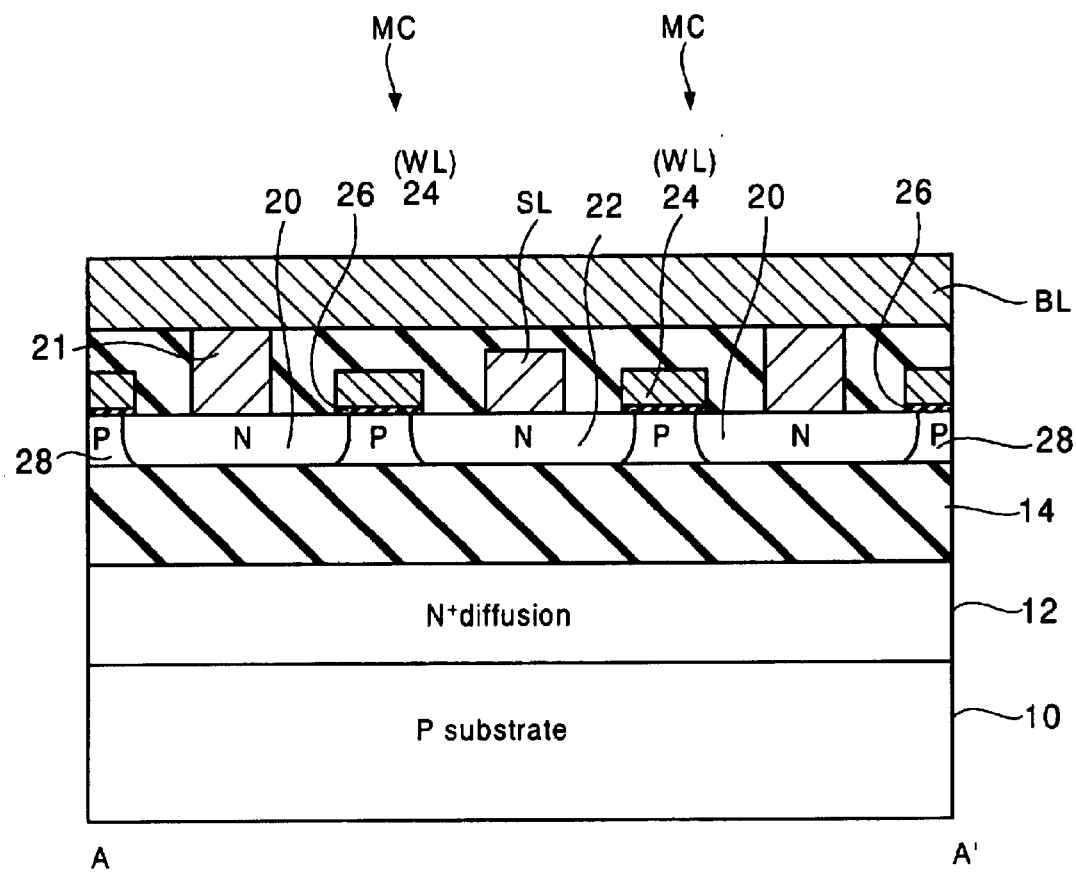
FIG. 31 is a sectional view taken along the line A–A' of the memory cell array in FIG. 30.
Figure 32:
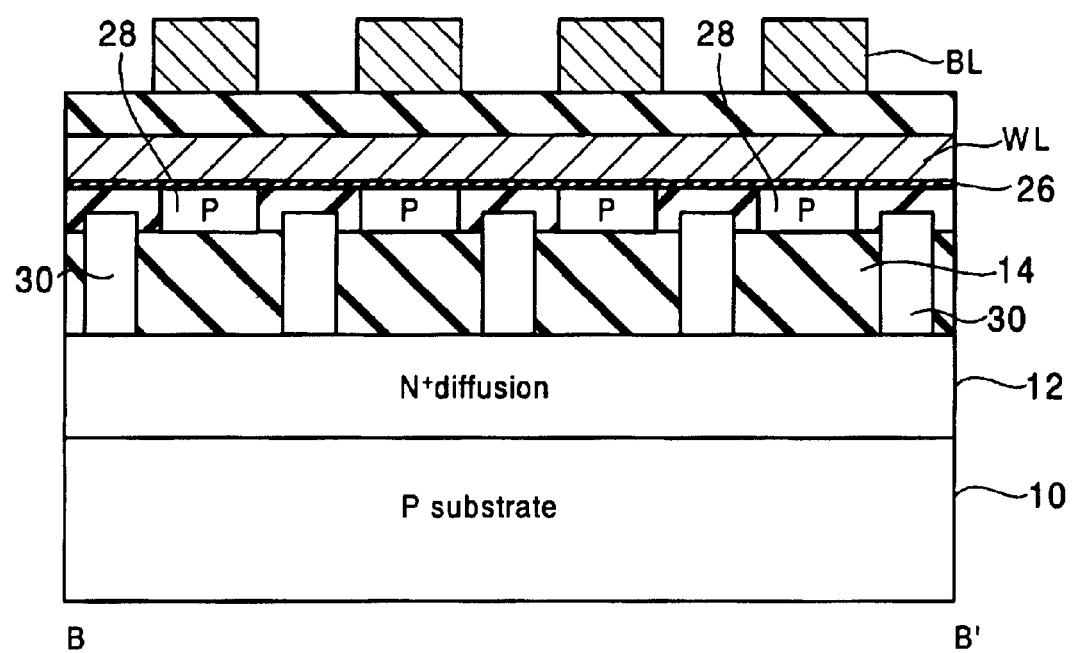
FIG. 32 is a sectional view taken along the line B–B' of the memory cell array in FIG. 30.
Figure 33:
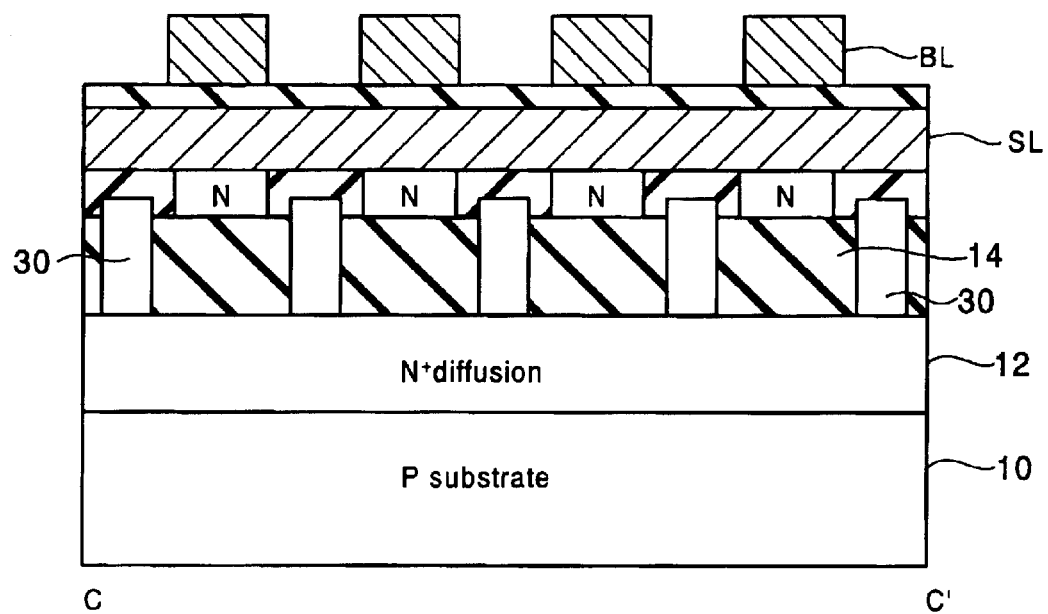
FIG. 33 is a sectional view taken along the line C–C' of the memory cell array in FIG. 30.
Figure 34:
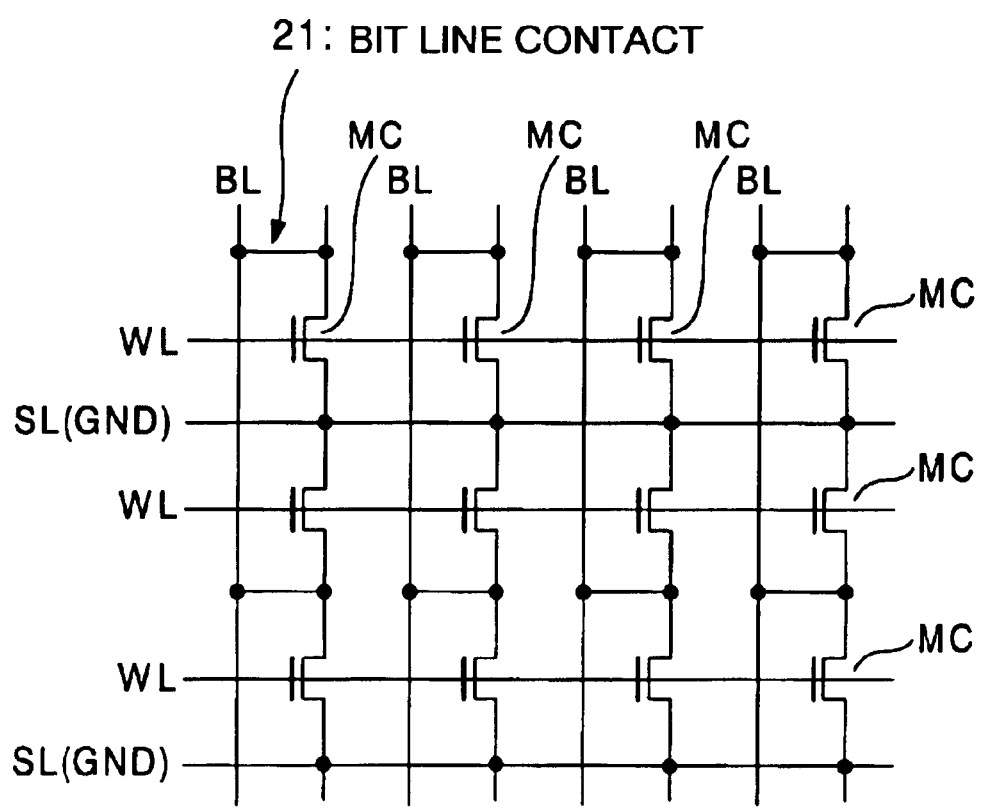
FIG. 34 is a diagram showing an equivalent circuit of the memory cell array in FIG. 30.
Figure 35:
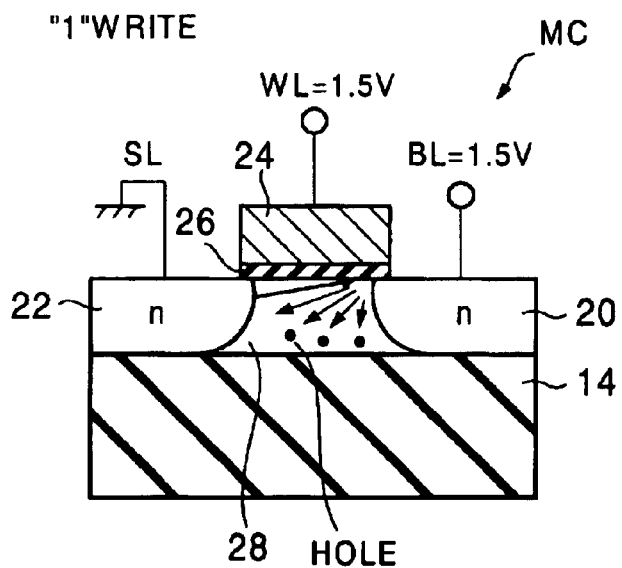
FIG. 35 is a view explaining a principle when "1" data is written into an FBC structured memory cell.
Figure 36:
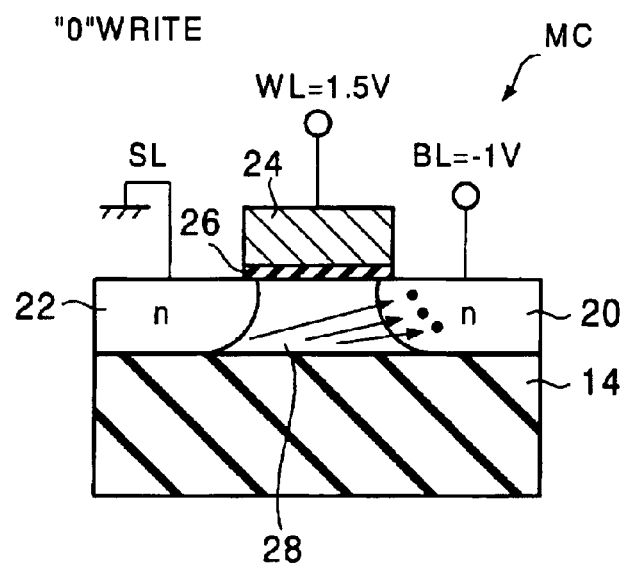
FIG. 36 is a view explaining a principle when "0" data is written into the FBC structured memory cell.
Figure 37:
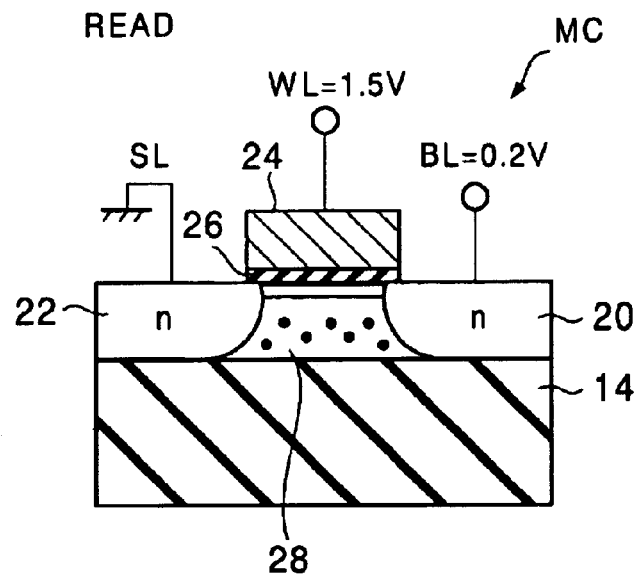
FIG. 37 is a view explaining a principle when data in the FBC structured memory cell is read.
Figure 38:
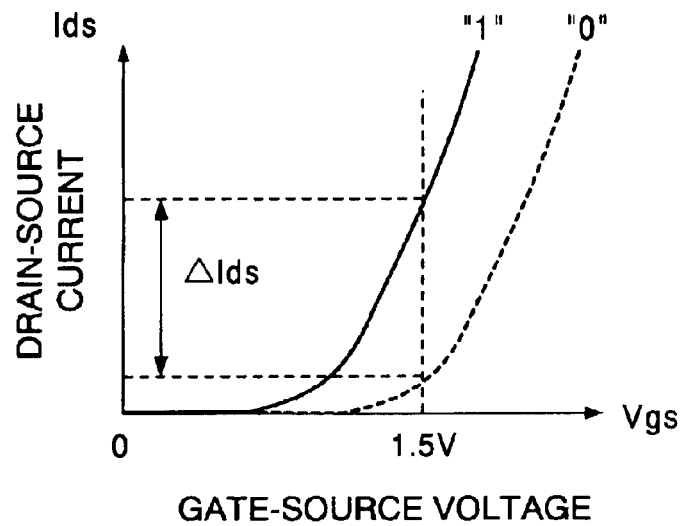
FIG. 38 is a graph showing the relation between a cell current flowing between a drain and a source of the memory cell and a gate-source voltage when the memory cell holds the "0" data and when the memory cell holds the "1" data.

FIG. 28 is a diagram explaining the operational waveforms in the refresh sequence, and FIG. 29 is a diagram showing the relation between bit line voltage in Step 3, Step 4, and Step 5 and latch data in this refresh sequence in tabular form. In this embodiment, this refresh sequence is performed with the two word lines WL with the source line SL therebetween as a unit. Namely, the refresh sequence is performed with each of the row decoder units 620 as a unit.

As can be seen from these drawings, the refresh sequence includes five steps of Step 1 to Step 5. In Step 1, by driving one word line (the first word line) WL of the pair of word lines, data in the first memory cell MC is read and stored in the latch circuit L1. In Step 2, by driving the other word line (the second word line) WL of the pair of word lines, data in the second memory cell MC is read and stored in the latch circuit L2. In Step 3, the "1" data is written into both the first memory cell MC and the second memory cell MC. In Step 4, the data stored in the latch circuit L1 is written back to the first memory cell MC. In Step 5, only when the latch circuit L2 latches the "0" data, the "0" data is written into the adjacent cell.

Namely, the "1" disturb occurs when the "1" data is written into a cell adjacent to the memory cell MC which holds the "0" data. Therefore, in this embodiment, after the "1" data is written into both the first memory cell MC and the second memory cell MC in Step 3, the "0" data is written back to the first memory cell MC and the second memory cell MC in Step 4 and Step 5 as necessary on condition that the "1" disturb does not occur. The first memory cell MC here means the memory cell MC specified by the refresh address signal generated by the controller 160, and the second memory cell MC means the memory cell MC sharing the source line SL with the first memory cell MC and located adjacent to the first memory cell MC.

A reset period between Step 4 and Step 5 is provided to reset the voltage of the bit line BL to 0 V.

Moreover, similarly to the write sequence, the refresh sequence is also performed in parallel in the sense units 600 provided in the semiconductor memory device. Accordingly, in one refresh sequence, refresh can be performed for the plural memory cells MC. More specifically, in one refresh sequence shown in FIG. 28, the memory cells MC the number of which is twice that of the sense units 600 can be refreshed.

In a more detailed explanation, in Step 1, since the ADJ signal is low and the PAIR signal is low, one word line (the first word line) WL out of the pair of word lines selected by the row decoder unit 620 specified by the row address signal A1, A2, ..., An−1 of the refresh address signal is selected and goes to 1.5 V.

Further, since the L1ON signal is high, the MIS transistor N1 is turned on. Furthermore, since the LTC1 signal is high, the latch circuit L1 is brought into a data capture state, and the sense amplifier 302 is activated by the SAEN signal, whereby a current read from the first memory cell MC is sensed by the sense amplifier 302 and stored as read data in the latch circuit L1.

Contrary to this, in Step 2, since the ADJ signal is high and the PAIR signal is low, the other word line (the second word line) WL out of the pair of word lines selected by the row decoder unit 620 specified by the row address signal A1, A2, ..., An−1 of the refresh address signal is selected and goes to 1.5 V.

Further, since the L2ON signal is high, the MIS transistor N2 is turned on. Furthermore, since the LTC2 signal is high, the latch circuit L2 is brought into a data capture state, and the sense amplifier 302 is activated by the SAEN signal, whereby a current read from the second memory cell MC is sensed by the sense amplifier 302 and stored as read data in the latch circuit L2.

In Step 3, since the S1 signal goes high, the MIS transistor N3 is turned on. As a result, 1.5 V is supplied to the bit line BL. Further, since the PAIR signal is high, both of the pair of word lines selected by the row decoder unit 620 specified by the row address signal A1, A2, ..., An−1 are 1.5 V.

Consequently, the "1" data is written into both the first memory cell MC and the second memory cell MC.

In Step 4, the L1ON signal and the S2 signal go high. Hence, the data latched by the latch circuit L1 is supplied to the bit line BL. Namely, −1 V is supplied to the bit line BL when the latch circuit L1 latches the "0" data, and 1.5 V is supplied to the bit line BL when the latch circuit L1 latches the "1" data. Moreover, since the ADJ signal is low and the PAIR signal is low, one word line (the first word line)WL out of the pair of word lines selected by the row decoder unit 620 specified by the row address signal A1, A2, ..., An−1 is selected and held at 1.5 V. Consequently, the data latched by the latch circuit L1 is written into the first memory cell MC.

During a reset period subsequent to Step 4, the BLRST signal goes high, and thereby the MIS transistor Tr202 is turned on. Consequently, the voltages of all the bit lines BL are reset to 0 V.

In Step 5, since the ADJ signal goes high and the PAIR signal is low, the other word line (the second word line) WL out of the pair of word lines selected by the row decoder unit 620 specified by the row address signal A1, A2, ..., An−1 is selected and goes to 1.5 V. Moreover, since the S3 signal goes high, the MIS transistor N6 is turned on.

Since the output signal of the inverter IN304 of the latch circuit L2 is high when the latch circuit L2 latches the "0" data, the MIS transistor N5 is turned on. Thereby, −1 V (namely, the "0" data) is supplied to the bit line BL. Accordingly, the "0" data is written into the second memory cell MC.

On the other hand, since the output signal of the inverter IN304 of the latch circuit L2 is low when the latch circuit L2 latches the "1" data, the MIS transistor N5 is turned off. Thereby, the bit line BL is brought into a floating state. Accordingly, the write into the second memory cell MC is not performed. Namely, the second memory cell MC maintains the "1" data written in Step 3.

Note that, in this embodiment, even if the latch circuit L1 latches the "1" data in Step 4, the "1" data is positively written into the first memory cell MC, but the "1" data need not be necessarily written, and as in Step 5, by bringing the bit line BL into a floating state, the "1" data which has been already written into the first memory cell MC may be maintained.

As stated above, according to the semiconductor memory device according to this embodiment, the destruction of data in the memory cell MC due to the "1" disturb can be avoided. In other words, only when the adjacent cell sharing the source line SL with the selected cell holds the "0" data after data is written into the selected cell, this adjacent cell is refreshed. Hence, even if data in the adjacent cell is changed to the "1" data by the influence of the "1" disturb when data is written into the selected cell, the data can be returned to the "0" data by writing the "0" data again. Accordingly, the "1" disturb of the adjacent cell can be circumvented.

Similarly, also in the refresh sequence, after the "1" data is once written into both the first memory cell MC corresponding to the selected cell and the second memory cell MC corresponding to the adjacent cell, the "0" data is written into the first memory cell MC when the first memory cell MC is the memory cell MC which holds the "0" data (Step 4), and the "0" data is written into the second memory cell MC when the second memory cell MC holds the "0" data (Step 5). Hence, occurrence of an "1" disturb in the refresh operation can be avoided.

Note that, the present invention is not limited to the aforementioned embodiments, and various modifications can be made therein. For example, the MIS transistor in each of the embodiments is an example of a switch, and switches of other types may be used instead. Moreover, it is possible to optionally change the order of steps in the read sequence, the order of steps in the write sequence, the order of steps in the refresh sequence within the limits in which the operation thereof is not hindered. Further, respective voltage values used in the aforementioned embodiments are given only as examples, and hence the voltage values are not limited to these voltage values.

In the aforementioned embodiments, based on the ADJ signal and the /ADJ signal, the selected word line WL specified by the address signal A1, A2, . . . , An or the adjacent word line WL located adjacent to this selected word line WL is driven, and hence, when the address signal A1, A2, . . . , An is inputted, the memory cell MC connected to the adjacent word line adjacent to the selected word line WL specified by this address signal A1, A2, . . . , An can be accessed (for read, write and refresh) as necessary. Accordingly, the row decoder 320, the predecoder 322, and the like according to the present invention can be used for purposes other than that of avoiding the destruction of data in the memory cell MC due to the "0" disturb or the "1" disturb stated above.

Moreover, according to the aforementioned row decoder 320, predecoder 322, and the like, based on the PAIR signal, both the selected word line WL specified by the address signal A1, A2, . . . , An and the adjacent word line WL located adjacent to this selected word line WL can be driven. Therefore, the row decoder 320, the predecoder 322, and the like according to the present invention can be used for purposes other than that of avoiding the destruction of data in the memory cell MC due to the "0" disturb or the "1" disturb stated above.

What is claimed is:

1. A semiconductor memory device comprising:
a memory cell array which includes a plurality of memory cells arranged in a matrix form, each of the memory cells including a transistor which has a source, a drain and a channel body between the source and the drain, each of the memory cells storing data depending on whether or not majority carriers are accumulated in the channel body;
a plurality of word lines, each of which is connected to gate electrodes of the memory cells arranged in a first direction;
a plurality of bit lines, each of which is connected to the memory cells arranged in a second direction which intersects the first direction and configured to read data stored in the memory cells;
a decoding circuit which is supplied with an address signal and a first control signal, the decoding circuit driving a selected word line which is the word line specified by the address signal or an adjacent word line which is the word line adjacent to the selected word line on the basis of the first control signal; and
a sense unit which is connected to a bit line and reads data stored in the memory cell which is connected to the word line driven by the decoding circuit.

2. The semiconductor memory device as set forth in claim 1, wherein a second control signal is supplied to the decoding circuit and the decoding circuit drives both the selected word line and the adjacent word line on the basis of the second control signal.

3. The semiconductor memory device as set forth in claim 2, wherein the adjacent word line is the word line connected to the memory cell which is adjacent to and shares the bit line with the memory cell connected to the selected word line.

4. The semiconductor memory device as set forth in claim 3, wherein the sense unit comprises a first latch circuit and a second latch circuit configured to latch data.

5. The semiconductor memory device as set forth in claim 4, wherein, in a write sequence, the first latch circuit latches data to be written into a selected cell which is the memory cell to be written and the second latch circuit latches data read from an adjacent cell which is the memory cell sharing the bit line with the selected cell and located adjacent to the selected cell, and
write procedure is changed on the basis of the data latched in the first latch circuit and the second latch circuit.

6. The semiconductor memory device as set forth in claim 4, wherein, in a write sequence, the first latch circuit latches data to be written into a selected cell which is the memory cell to be written and the second latch circuit latches data read from an adjacent cell which is the memory cell sharing the bit line with the selected cell and located adjacent to the selected cell, and
in a case where a state in which the majority carriers are accumulated in the channel body is defined as a first data state and a state in which the majority carriers are not accumulated in the channel body is defined as a second data state,
the second data state is simultaneously written into both the selected cell and the adjacent cell in a case where both the first latch circuit and the second latch circuit latch the second data state, and
a data state latched in the first latch circuit is written into the selected cell in a case where at least one of the first latch circuit and the second latch circuit latches the first data state.

7. The semiconductor memory device as set forth in claim 6, the timing of operation for simultaneously writing the second data state into both the selected cell and the adjacent cell is different from the timing of operation for writing the data state latched in the first latch circuit into the selected cell.

8. The semiconductor memory device as set forth in claim 7, wherein, in a refresh sequence, the first latch circuit latches data read from a first memory cell which is selected by an inputted refresh address signal, and the second latch circuit latches data read from a second memory cell which shares the bit line with the first memory cell and which is adjacent to the first memory cell,
the second data state is simultaneously written into the first memory cell and the second memory cell in a case where both the first latch circuit and the second latch circuit latch the second data state, and
a data state latched in the first latch circuit is written into the first memory cell and a data state latched in the second latch circuit is written into the second memory cell in timing different from the timing in writing the data state into the first memory cell, in a case where at least one of the first latch circuit and the second latch circuit latches the first data state.

9. The semiconductor memory device as set forth in claim 2, wherein the adjacent word line is the word line connected to the memory cell which is adjacent to and shares a source line with the memory cell connected to the selected word line.

10. The semiconductor memory device as set forth in claim 9, wherein the sense unit comprises a first latch circuit and a second latch circuit configured to latch data.

11. The semiconductor memory device as set forth in claim 10, wherein, in a write sequence, the first latch circuit latches data to be written into a selected cell which is the memory cell to be written and the second latch circuit latches data read from an adjacent cell which is the memory cell sharing the source line with the selected cell and located adjacent to the selected cell, and in a case where a state in which the majority carriers are accumulated in the channel body is defined as a first data state and a state in which the majority carriers are not accumulated in the channel body is defined as a second data state, after a data state latched in the first latch circuit is written into the selected cell, the second data state is written into the adjacent cell if the second latch circuit latches the second data state.

12. The semiconductor memory device as set forth in claim 11, wherein, in a refresh sequence, the first latch circuit latches data read from a first memory cell which is selected by an inputted refresh address signal, and the second latch circuit latches data read from a second memory cell which shares the source line with the first memory cell and which is adjacent to the first memory cell, and after the first data state is written into the first memory cell and the second memory cell, the second data state is written into the first memory cell if the first latch circuit latches data of the second data state and the second data state is written into the second memory cell if the second latch circuit latches data of the second data state.

13. The semiconductor memory device as set forth in claim 1, wherein the memory cell array is divided into a plurality of cell array blocks, the word lines comprises main word lines and sub-word lines, the main word lines extending in the first direction across the cell array blocks, each of the sub-word lines being connected to the gate electrodes of the memory cells arranged in the first direction within each of the cell array blocks, a pair of the sub-word lines are provided for each of the main word line in the cell array blocks, the pair of sub-word lines being connected to the gate electrodes of pairs of the memory cells, each of the pairs of the memory cells sharing the bit line with each other and located adjacent to each other, the sense unit is provided for each of the cell array blocks, and the decoding circuit drives a selected sub-word line which is the sub-word line specified by the address signal or an adjacent sub-word line which is the other sub-word line paired with the selected sub-word line on the basis of the first control signal in each of the cell array blocks.

14. The semiconductor memory device as set forth in claim 13, wherein a second control signal is supplied to the decoding circuit and the decoding circuit drives both the selected sub-word line and the adjacent sub-word line on the basis of the second control signal in each of the cell array blocks.

15. The semiconductor memory device as set forth in claim 14, wherein each of the sense unit comprises a first latch circuit and a second latch circuit for latching data and supplies the second control signal to the decoding circuit.

16. The semiconductor memory device as set forth in claim 15, wherein, in a write sequence, the first latch circuit in each of the sense units latches data to be written into a selected cell which is the memory cell to be written and the second latch circuit in each of the sense units latches data read from an adjacent cell which is the memory cell sharing the bit line with the selected cell and located adjacent to the selected cell, and in a case where a state in which the majority carriers are accumulated in the channel body is defined as a first data state and a state in which the majority carriers are not accumulated in the channel body is defined as a second data state, the second data state is simultaneously written into both the selected cell and the adjacent cell in the cell array block corresponding to the sense unit in which both the first latch circuit and the second latch circuit latch the second data state, and a data state latched in the first latch circuit is written into the selected cell in the cell array block corresponding to the sense unit in which at least one of the first latch circuit and the second latch circuit latches the first data state.

17. The semiconductor memory device as set forth in claim 16, wherein, in a refresh sequence, the first latch circuit in each of the sense units latches data read from a first memory cell which is selected by an inputted refresh address signal, and the second latch circuit in each of the sense units latches data read from a second memory cell which shares the bit line with the first memory cell and which is adjacent to the first memory cell, the second data state is simultaneously written into the first memory cell and the second memory cell in the cell array block corresponding to the sense unit in which both the first latch circuit and the second latch circuit latch the second data state, and a data state latched in the first latch circuit is written into the first memory cell and a data state latched in the second latch circuit is written into the second memory cell in the cell array block corresponding to the sense unit in which at least one of the first latch circuit and the second latch circuit latches the first data state, in the timing different from the timing in writing the data state into the first memory cell.

18. The semiconductor memory device as set forth in claim 1, wherein the adjacent word line is the word line connected to the memory cell which is adjacent to and shares the bit line with the memory cell connected to the selected word line.

19. The semiconductor memory device as set forth in claim 18, wherein, in a write sequence, after the sense unit writes data into a selected cell which is the memory cell to be written, the sense unit refreshes an adjacent cell which is the memory cell sharing the bit line with the selected cell and located adjacent to the selected cell.

20. The semiconductor memory device as set forth in claim 1, wherein the channel body is in a floating state.

21. A method of controlling a semiconductor memory device including:

a memory cell array which includes a plurality of memory cells arranged in a matrix form, each of the memory cells including a transistor which has a source, a drain and a channel body between the source and the drain, each of the memory cells storing data depending on whether or not majority carriers are accumulated in the channel body;

a plurality of word lines, each of which is connected to gate electrodes of the memory cells arranged in a first direction; and a plurality of bit lines, each of which is connected to the memory cells arranged in a second direction which intersects the first direction and configured to read data stored in the memory cells, the method comprising:

acquiring an address signal;

acquiring a first control signal;

driving a selected word line which is the word line specified by the address signal or an adjacent word line which is the word line adjacent to the selected word line on the basis of the first control signal; and reading data stored in the memory cell which is connected to the driven word line, via the bit line.

22. The method of controlling the semiconductor memory device as set forth in claim 21 further comprising:

acquiring a second control signal; and driving both the selected word line and the adjacent word line on the basis of the second control signal.

23. The method of controlling the semiconductor memory device as set forth in claim 22, wherein the adjacent word line is the word line connected to the memory cell which is adjacent to and shares the bit line with the memory cell connected to the selected word line.

24. The method of controlling the semiconductor memory device as set forth in claim 23, further comprising:

latching data to be written into a selected cell into a first latch circuit, wherein the selected cell is the memory cell into which the data is written;

latching data read from an adjacent cell into a second latch circuit, wherein the adjacent cell is the memory cell sharing the bit line with the selected cell and located adjacent to the selected cell; and changing write procedure on the basis of the data latched in the first latch circuit and the second latch circuit.

25. The method of controlling the semiconductor memory device as set forth in claim 23, further comprising:

latching data to be written into a selected cell into a first latch circuit, wherein the selected cell is the memory cell into which the data is written;

latching data read from an adjacent cell into a second latch circuit, wherein the adjacent cell is the memory cell sharing the bit line with the selected cell and located adjacent to the selected cell;

simultaneously writing a second data state into both the selected cell and the adjacent cell in a case where both the first latch circuit and the second latch circuit latch the second data state, wherein a state in which the majority carriers are accumulated in the channel body is defined as a first data state and a state in which the majority carriers are not accumulated in the channel body is defined as the second data state; and writing a data state latched in the first latch circuit into the selected cell in a case where at least one of the first latch circuit and the second latch circuit latches the first data state.

26. The method of controlling the semiconductor memory device as set forth in claim 25, the timing of simultaneously writing the second data state into both the selected cell and the adjacent cell is different from the timing of writing the data state latched in the first latch circuit into the selected cell.

27. The method of controlling the semiconductor memory device as set forth in claim 26, further comprising:

latching data read from a first memory cell into the first latch circuit, wherein the first memory cell is selected by an inputted refresh address signal;

latching data read from a second memory cell into the second latch circuit, wherein the second memory cell shares the bit line with the first memory cell and is adjacent to the first memory cell;

simultaneously writing the second data state into the first memory cell and the second memory cell in a case where both the first latch circuit and the second latch circuit latch the second data state;

writing a data state latched in the first latch circuit into the first memory cell in a case where at least one of the first latch circuit and the second latch circuit latches the first data state; and writing a data state latched in the second latch circuit into the second memory cell in a case where at least one of the first latch circuit and the second latch circuit latches the first data state, in timing different from the timing in writing the data state latched in the first latch circuit into the first memory cell.

28. The method of controlling the semiconductor memory device as set forth in claim 22, wherein the adjacent word line is the word line connected to the memory cell which is adjacent to and shares a source line with the memory cell connected to the selected word line.

29. The method of controlling the semiconductor memory device as set forth in claim 28, further comprising:

latching data to be written into a selected cell into a first latch circuit, wherein the selected cell is the memory cell into which the data is written;

latching data read from an adjacent cell into a second latch circuit, wherein the adjacent cell is the memory cell sharing the source line with the selected cell and located adjacent to the selected cell;

writing a data state latched in the first latch circuit into the selected cell, wherein a state in which the majority carriers are accumulated in the channel body is defined as a first data state and a state in which the majority carriers are not accumulated in the channel body is defined as a second data state; and writing the second data state into the adjacent cell if the second latch circuit latches the second data state.

30. The method of controlling the semiconductor memory device as set forth in claim 29, further comprising:

latching data read from a first memory cell into the first latch circuit, wherein the first memory cell is selected by an inputted refresh address signal;

latching data read from a second memory cell into the second latch circuit, wherein the second memory cell shares the source line with the first memory cell and is adjacent to the first memory cell;

writing both the first data state into the first memory cell and the second memory cell;

writing the second data state into the first memory cell if the first latch circuit latches data of the second data state; and writing the second data state into the second memory cell if the second latch circuit latches data of the second data state.

31. The method of controlling the semiconductor memory device as set forth in claim 20, wherein the memory cell array is divided into a plurality of cell array blocks, the word lines comprises main word lines and sub-word lines, the main word lines extending in the first direction across the cell array blocks, each of the sub-word lines being connected to the gate electrodes of the memory cells arranged in the first direction within each of the cell array blocks, and a pair of the sub-word lines are provided for each of the main word line in the cell array blocks, the pair of the sub-word lines being connected to the gate electrodes of pairs of the memory cells, each of the pairs of the memory cells sharing the bit line with each other and located adjacent to each other, wherein the method further comprises:

acquiring the first control signal in each of the cell array blocks;

driving a selected sub-word line which is the sub-word line specified by the address signal or an adjacent sub-word line which is the other sub-word line paired with the selected sub-word line in each of the cell array blocks; and reading data stored in the memory cell which is connected to the driven word line in each of the cell array blocks.

32. The method of controlling the semiconductor memory device as set forth in claim 31, further comprising:

acquiring a second control signal; and driving both the selected sub-word line and the adjacent sub-word line on the basis of the second control signal in each of the cell array blocks.

33. The method of controlling the semiconductor memory device as set forth in claim 32, further comprising:

latching data to be written into a selected cell into a first latch circuit, wherein the selected cell is the memory cell into which the data is written;

latching data read from an adjacent cell into a second latch circuit, wherein the adjacent cell is the memory cell sharing the bit line with the selected cell and located adjacent to the selected cell;

simultaneously writing a second data state into both the selected cell and the adjacent cell in the cell array block in which both the first latch circuit and the second latch circuit latch the second data state, wherein a state in which the majority carriers are accumulated in the channel body is defined as a first data state and a state in which the majority carriers are not accumulated in the channel body is defined as the second data state; and writing a data state latched in the first latch circuit into the selected cell in the cell array block in which at least one of the first latch circuit and the second latch circuit latches the first data state.

34. The method of controlling the semiconductor memory device as set forth in claim 33, further comprising:

latching data read from a first memory cell into the first latch circuit, wherein the first memory cell is selected by an inputted refresh address signal;

latching data read from a second memory cell into the second latch circuit, wherein the second memory cell shares the bit line with the first memory cell and is adjacent to the first memory cell;

simultaneously writing the second data state into the first memory cell and the second memory cell in the cell array block in which both the first latch circuit and the second latch circuit latch the second data state;

writing a data state latched in the first latch circuit into the first memory cell in the cell array block in which at least one of the first latch circuit and the second latch circuit latches the first data state; and writing a data state latched in the second latch circuit into the second memory cell in the cell array block in which at least one of the first latch circuit and the second latch circuit latches the first data state, in timing different from the timing in writing the data state latched in the first latch circuit into the first memory cell.

35. The method of controlling the semiconductor memory device as set forth in claim 21, wherein the adjacent word line is the word line connected to the memory cell which is adjacent to and shares the bit line with the memory cell connected to the selected word line.

36. The method of controlling the semiconductor memory device as set forth in claim 35, further comprising:

writing data into a selected cell which is the memory cell to be written; and refreshing an adjacent cell which is the memory cell sharing the bit line with the selected cell and located adjacent to the selected cell.

* * * * *